(12) United States Patent
Thornton et al.

(10) Patent No.: US 8,847,625 B2
(45) Date of Patent: Sep. 30, 2014

(54) SINGLE CLOCK DISTRIBUTION NETWORK FOR MULTI-PHASE CLOCK INTEGRATED CIRCUITS

(71) Applicant: Southern Methodist University, Dallas, TX (US)

(72) Inventors: Mitchell Aaron Thornton, Dallas, TX (US); Rohit Menon, Austin, TX (US)

(73) Assignee: Southern Methodist University, Dallas, TX (US)

( * ) Notice: Subject to any disclaimer, the term of this patent is extended or adjusted under 35 U.S.C. 154(b) by 50 days.

(21) Appl. No.: 13/769,313

(22) Filed: Feb. 16, 2013

(65) Prior Publication Data

US 2013/0214816 A1    Aug. 22, 2013

Related U.S. Application Data

(60) Provisional application No. 61/599,898, filed on Feb. 16, 2012.

(51) Int. Cl.
*H03K 19/00* (2006.01)
*H03L 7/00* (2006.01)
*G06F 1/04* (2006.01)
*G06F 1/10* (2006.01)
*H03K 19/096* (2006.01)

(52) U.S. Cl.
CPC ............... *H03K 19/096* (2013.01); *G06F 1/10* (2013.01)
USPC ................. 326/93; 326/96; 326/59; 327/141; 327/147; 327/156; 327/291; 327/299

(58) Field of Classification Search
USPC .......... 326/93, 96, 59, 60; 327/141, 144, 147, 327/156, 164–166, 291, 293–299
See application file for complete search history.

(56) References Cited

U.S. PATENT DOCUMENTS 4,107,549 A * 8/1978 Moufah .......................... 326/59
5,017,817 A * 5/1991 Yamakawa ..................... 326/59

(Continued)

OTHER PUBLICATIONS

Chattopadhyay, et al. "Reference-Based Clock Distribution Architectures," in Proc. IEEE Midwest Symposium on Circ. and Sys., 2006, pp. 704-708.

(Continued)

*Primary Examiner* — Vibol Tan
(74) *Attorney, Agent, or Firm* — Daniel J. Chalker; Chalker Flores, LLP

(57) ABSTRACT

A multi-valued logic (MVL) circuit includes a MVL clock generator that generates a MVL clock signal having three or more ith MVL levels, a single MVL clock signal distribution network connected to the MVL clock generator, and three or more ith MVL selection circuits connected to the single MVL clock signal distribution network where i=0 to N and N>=3. Each ith MVL selection circuit corresponds to a specified ith MVL level. The ith MVL selection circuit outputs an ith binary clock signal having: (a) a first logic level whenever the MVL clock signal is equal to the ith MVL level and the ith data input receives the first logic level, (b) a second logic level whenever the MVL clock signal is equal to the ith MVL level and the ith data input receives the second logic level, and (c) a previous logic level of the ith binary clock signal whenever the MVL clock signal is not equal to the ith MVL level.

35 Claims, 18 Drawing Sheets

(56) References Cited

U.S. PATENT DOCUMENTS

| | | | |
|---|---|---|---|
| 6,133,754 A * | 10/2000 | Olson | 326/59 |
| 6,437,624 B1 | 8/2002 | Kojima et al. | |
| 6,819,728 B2 | 11/2004 | Boerstler | |
| 7,088,153 B2 | 8/2006 | Bilak et al. | |
| 7,369,075 B2 * | 5/2008 | Ishii et al. | 341/144 |
| 7,747,173 B1 | 6/2010 | Ho et al. | |
| 7,755,391 B2 * | 7/2010 | Hibino et al. | 326/59 |
| 2010/0301915 A1 | 12/2010 | Hart et al. | |

OTHER PUBLICATIONS

El-Moursy, et al. "Exponentially Tapered H-Tree Clock Distribution Networks," IEEE Trans. VLSI, vol. 13, No. 8, Aug. 2005, pp. 971-975.

Friedman, Eby G. "Clock Distribution Networks in Synchronous Digital Integrated Circuits," Proc. of IEEE, vol. 89, No. 5, 2001, pp. 665-692.

Jackson, et. al., "Clock Routing for High-Performance ICs," Proc. of ACM/IEEE Design Automation Conf., pp. 573-579, 1990.

Nedovic, N. and Oklobdzija, "Dual-Edge Triggered Storage Elements and Clocking Strategy for Low-Power Systems," IEEE Trans. VLSI, vol. 13, No. 5, 2005, pp. 577-590.

Vasundara Patel and Gurumurthy, K.S., "Static Random Access Memory Using Quaternary Latch", Int. Jour. of Eng. Sci. and Tech., 2(11), 2010, 6371-6379.

Smith, J.E. "An Analysis of Pipeline Clocking" Mar. 19, 1990, 7 pp.

Wagner, Kenneth D. "Clock System Design" Oct. 1988, 0740-7475/88/1000-09$, 1988 IEEE, pp. 9-27.

Zhao, X., Minz, J. and Lim, S.K., "Low-Power and Reliable Clock Network Design for Through-Silicon Via (TSV) Based 3D ICs," IEEE Trans. Comp., Pkg., and Man. Tech., vol. 1, No. 2, 2011, pp. 247-255.

Datla, S., et al., "Quaternary addition circuits based on SUSLOC voltage-mode cells and modeling with System Verilog," Proc. of IEEE Int. Sym. on Multiple-Valued Logic, pp. 256-261, 2009.

Gong, M., et al., "Binning Optimization based on SSTA for Transparently-Latched Circuits," IEEE Transactions on Computer-Aided Design of Integrated Circuits and Systems, 30(2), 270-283, 2011.

Menon, R.P., et al., "Global Multiple-valued Clock Approach for High-performance Multi-phase Clock Integrated Circuits," Proc. of IEEE Int. Symposium on ultiple-Valued Logic, pp. 19-24, 2012.

* cited by examiner

| FINITE STATE MACHINE/CONTROLLER CIRCUITS | | | | | | | | | | |
|---|---|---|---|---|---|---|---|---|---|---|
| NAME | Counter | | Vending | | SO Controller | | Traffic CTL | | Keylock | |
| # States | 4 | | 6 | | 4 | | 4 | | 10 | |
| Logic System | Binary | MVL | Binary | MVL | Binary | MVL | Binary | MVL | Binary | MVL |
| # Interconnects | 20 | 5 | 48 | 38 | 63 | 51 | 89 | 48 | 74 | 32 |
| % Reduction | 75% | | 21% | | 19% | | 46% | | 57% | |
| Max Path Delay (ns) | 14.9 | 8.55 | 21.1 | 19.5 | 32.4 | 32.0 | 49.5 | 37.5 | 22.6 | 19.3 |
| % CLK Freq. Increase | 43% | | 7% | | 1% | | 24% | | 15% | |

SINGLE CLOCK DISTRIBUTION NETWORK FOR MULTI-PHASE CLOCK INTEGRATED CIRCUITS

CROSS REFERENCE TO RELATED APPLICATIONS

This patent application is a non-provisional patent application of U.S. provisional patent application 61/599,598 filed on Feb. 16, 2012, which is hereby incorporated by reference in their entirety.

FIELD OF THE INVENTION

The present invention relates generally to the field of digital circuitry and, more particularly, to a single clock distribution network for multi-phase clock integrated circuits.

BACKGROUND OF THE INVENTION

Increasing the performance of Integrated Circuits (ICs) is of paramount concern to support advances in technology. Many techniques are employed for increasing performance, ranging from new and improved fabrication technology to advances in design techniques. One design approach is that of partitioning a globally clocked synchronous logic circuit into disjoint subcircuits referred to as 'phases.' Each phase then utilizes a private clock distribution network with a substantially reduced clock frequency. However, overall performance does not degrade since the multiple subcircuits may all operate concurrently. This approach, referred to here as 'Multi-phase clocking' is a form of pipelining since it incorporates temporal concurrency. Pipelining is a well-known digital design performance enhancement technique whereby concurrency is exploited in a temporal sense as opposed to physical duplication of functional units [16].

While multi-phase clocking has the advantage of retaining high-performance while relaxing timing constraints within each subcircuit phase domain, the significant disadvantage is that multiple clock distribution networks must be provided for each phase clock instead of a single global clock distribution network. Such clock distribution networks are a well-known source of power dissipation and overall area utilization.

The chief concept utilized is that of a Multiple-Valued Logic (MVL) global clock signal. MVL concepts have been devised and used by circuit designers [1, 2, 3, 5] and also developers of Electronic Design Automation (EDA) tools for digital circuit simulation and synthesis. MVL circuitry is attractive for high-speed IC designs as reduction in chip area, increase in performance, and reduced power dissipation characteristics are major requirements for future ICs.

Clocking is an essential concept in the design of synchronous digital systems [10]. A synchronous system is comprised of storage elements and combinational logic that together make up a Finite State Machine (FSM) controller and a datapath. A typical clock signal has to be distributed to a large number of storage elements and hence it has the highest fan-out of any node in a typical digital design. As a result, a clock distribution system alone can consume up to 25-70% of the power budget of the IC chip [4, 17, 18, 19, 20]. Clocking in digital systems continues to gain importance since the clock frequency is increasing rapidly, approximately doubling every three years. The increase in clock uncertainties due to higher clock frequencies has made designing clock distributions in high-performance microprocessors and other ICs increasingly difficult. Hence distributed multi-phase clock systems can play a vital role in high-performance circuit designs where independent clock networks with lower frequency non-overlapping clock signals are physically distributed to disjoint subsets of clocked storage elements.

Many high-performance digital integrated circuits being produced today use multi-phase clock distribution systems [7,8,9]. The clock distribution networks used in multi-phase clock distribution systems require a significant amount of resources in terms of area since each clock phase requires an independent distribution network. Difficulties also arise in maintaining synchronization among the independent clock phases. Such high performance digital integrated circuits typically use multi-phase clock distribution systems with level-sensitive latches as clocked storage elements. A set of N periodic non-overlapping binary clock signals propagate over each of the clock phase distribution networks and drive disjoint subsets of level-sensitive latches providing enhanced throughput and performance. This performance enhancement can result in increased area characteristics since the individual distribution networks are required for each clock phase.

Other current approaches in overcoming challenges in clocking include the use of reference-based distribution architectures [22] involving multi-tap distribution lines. Another approach modifies the binary clock signal to have a swing of one-half Vdd in an attempt to decrease power consumption [23]. The half-swing approach has some similarity to the method described here in that overall clock signal voltage amplitudes are modified.

Level-sensitive transparent latches [6] as state-holding elements provide high-performance and low power consumption [13] as compared to flip-flops. Level-sensitive latches are attractive since they require fewer transistors to implement as compared to edge-sensitive storage devices. However, the transparent nature of latches increases the difficulty in meeting timing criteria as compared to the use of edge-sensitive circuits. Because timing constraints are considerably relaxed within each subcircuit of a multi-phased clocked logic design, latches are more easily used and are often the state-holding element of choice for these types of designs.

For example, FIG. 1 is a logic symbol for a level-sensitive latch or D-latch 100 in accordance with the prior art. A level-sensitive latch or D-latch 100 is a logic circuit which acts as a data storage element. A D-latch 100 has a data input signal (D), a gate/enable signal (EN), an output (Q) and an inverted output (Q' or $\overline{Q}$). The characteristic table for a binary D-latch 100 is shown Table 1.

TABLE 1

| D-Latch Characteristic Table | | | |
| --- | --- | --- | --- |
| EN/CLK | D | Q | $\overline{Q}$ |
| 0 | X | $Q_{prev}$ | $\overline{Q}_{prev}$ |
| 1 | 0 | 0 | 1 |
| 1 | 1 | 1 | 0 |

A typical CMOS voltage-mode D-latch circuit 100 can be implemented in a fashion as shown in FIG. 2. The Data input signal (D) is input to a transmission gate 200 controlled by the enable signal (EN). The EN input serves as the latch's gate input and is connected to the output of the modified literal selection gate. The output of the transmission gate 200 is connected to a latch comprised of two inverters 202a and 202b where the topmost inverter 202b serves as a keeper logic circuit.

A typical high performance IC design 300 with multiple phase clock signal distribution networks $302_1$, $302_2$ and $302_N$ in accordance with the prior art is depicted in FIG. 3. An on-chip Phase Locked Loop (PLL) 304 receives the binary external clock input 306 to generate a stable high frequency global clock signal that is then input to a multi-phase generation circuit 308. The phase generation circuit 308 then produces each of the N individual clock phase signals $\Phi_0$, $\Phi_1, \ldots, \Phi_N$ that are in turn distributed to disjoint sets of sub-circuits $310_0$, $310_1$ and $310_N$ over corresponding Clock Distribution Tree (CDT) networks $312_0$, $312_1$ and $312_N$.

The N multiple phase shifted clock signals are represented by $\Phi_0, \Phi_1, \ldots, \Phi_N$. For example, a quaternary logic network will have four phase shifted clock signals, represented by $\Phi_0$, $\Phi_1, \Phi_2$ and $\Phi_3$. An example of the clock signal waveforms for the external global clock input 306 and the resulting four phase shifted clock signals $\Phi_0, \Phi_1, \Phi_2$ and $\Phi_3$ are shown in FIG. 4. The four multiple non-overlapping phase shifted clock signals, $\Phi_0, \Phi_1, \Phi_2$ and $\Phi_3$, propagate to disjoint sets of sub-circuits over corresponding Clock Distribution Tree (CDT) networks $312_0$, $312_1$ and $312_N$. Each sub-circuit $310_0$, $310_1$ and $310_N$ is comprised of combinational logic along with sequential logic elements that are typically level-sensitive transparent latches.

As is apparent from the foregoing discussion, multi-phase clock distribution systems require a significant amount of resources in terms of area and power dissipation. Accordingly, there is a need for a single clock distribution network for a MVL clock signal.

SUMMARY OF THE INVENTION

The present invention provides a single global clock distribution network for a Multiple-Valued Logic (MVL) clock signal in combination with new level-sensitive latches designed to be transparent for a specific portion of the global MVL clock signal. This approach allows for the use of conventional binary logic fabrication technology since the only MVL components required are the global clock generator and a modified literal selection gate that can be implemented as small analog circuits. A purely binary implementation approach is also described where the MVL clock signal is replaced by a binary encoded signal and the phase-sensitive latches are augmented by including a binary decoder function that allows for implementation of the method using commercially available FPGA devices or a standard cell library containing only binary logic cells.

More specifically, one embodiment of the present invention provides a multi-valued logic circuit having a multi-valued logic (MVL) clock generator, a single MVL clock signal distribution network connected to the MVL clock generator, a first MVL selection circuit having a first enable/clock input connected to the single MVL clock signal distribution network, one or more intermediate MVL selection circuits, each intermediate MVL selection circuit having an intermediate enable/clock input connected to the single MVL clock signal distribution network, and a Nth MVL selection circuit having a Nth enable/clock input connected to the single MVL clock signal distribution network. The MVL clock generator generates a MVL clock signal having a first MVL level, one or more intermediate MVL levels and a Nth MVL level. The first MVL selection circuit also has a first data input and a first output. The first MVL selection circuit outputs a first binary clock signal via the first output having: (a) a first logic level whenever the MVL clock signal is equal to the first MVL level and the first data input receives the first logic level, (b) a second logic level whenever the MVL clock signal is equal to the first MVL level and the first data input receives the second logic level, and (c) a previous logic level of the first binary clock signal whenever the MVL clock signal is not equal to the first MVL level. Each intermediate MVL selection circuit also has an intermediate data input and an intermediate output. Each intermediate MVL selection circuit corresponds to a specified intermediate MVL level selected from the one or more intermediate MVL levels and outputs an intermediate binary clock signal via the intermediate output having: (a) the first logic level whenever the MVL clock signal is equal to the specified intermediate MVL level and the intermediate data input receives the first logic level, (b) a second logic level whenever the MVL clock signal is equal to the specified intermediate MVL level and the intermediate data input receives the second logic level, and (c) a previous logic level of the intermediate binary clock signal whenever the MVL clock signal is not equal to the specified intermediate MVL level. The Nth level selection circuit also has a Nth data input and a Nth output. The Nth MVL selection circuit outputs a Nth binary clock signal via the Nth output having: (a) a first logic level whenever the MVL clock signal is equal to the Nth MVL level and the Nth data input receives the first logic level, (b) a second logic level whenever the MVL clock signal is equal to the Nth MVL level and the Nth data input receives the second logic level, and (c) a previous logic level of the Nth binary clock signal whenever the MVL clock signal is not equal to the Nth MVL level.

Another embodiment of the present invention provides a multi-valued logic circuit a MVL clock generator, a single MVL clock signal distribution network connected to the MVL clock generator, a first MVL selection circuit having a first enable/clock input connected to the single MVL clock signal distribution network, a second MVL selection circuits having a second enable/clock input connected to the single MVL clock signal distribution network, a third MVL selection circuit having a third enable/clock input connected to the single MVL clock signal distribution network, and a fourth MVL selection circuit having a fourth enable/clock input connected to the single MVL clock signal distribution network. The MVL clock generator generates a MVL clock signal comprising a logic "0", a logic "1", a logic "2" and a logic "3". The first MVL selection circuit also has a first data input, a first output and a first inverted output. The first MVL selection circuit outputs a first binary clock signal having a logic level in accordance with the following table:

| the first enable/clock input | the first data input | the first output | the first inverted output |
|---|---|---|---|
| 0 | 0 | 0 | 1 |
| 0 | 1 | 1 | 0 |
| 1 | X | $Q_{prev}$ | $\overline{Q}_{prev}$ |
| 2 | X | $Q_{prev}$ | $\overline{Q}_{prev}$ |
| 3 | X | $Q_{prev}$ | $\overline{Q}_{prev}$ | where X=logic "0" or logic "1", $Q_{prev}$=a previous logic level of the first binary clock signal, and $Q'_{prev}$=an inverse value of the previous logic level of the first binary clock signal. The second MVL selection circuit also has a second data input, a second output and a second inverted output The second MVL selection circuit outputs a second binary clock signal having a logic level in accordance with the following table:

| the second<br>enable/clock input | the second data<br>input | the second<br>output | the second<br>inverted output |
|---|---|---|---|
| 0 | X | $Q_{prev}$ | $\overline{Q}_{prev}$ |
| 1 | 0 | 0 | 1 |
| 1 | 1 | 1 | 0 |
| 2 | X | $Q_{prev}$ | $\overline{Q}_{prev}$ |
| 3 | X | $Q_{prev}$ | $\overline{Q}_{prev}$ |

The third MVL selection circuit also has a third data input, a third output and a third inverted output. The third MVL selection circuit outputs a third binary clock signal having a logic level in accordance with the following table:

| the third<br>enable/clock input | the third data<br>input | the third<br>output | the third<br>inverted output |
|---|---|---|---|
| 0 | X | $Q_{prev}$ | $\overline{Q}_{prev}$ |
| 1 | X | $Q_{prev}$ | $\overline{Q}_{prev}$ |
| 2 | 0 | 0 | 1 |
| 2 | 1 | 1 | 0 |
| 3 | X | $Q_{prev}$ | $\overline{Q}_{prev}$ |

The fourth MVL selection circuit also has a fourth data input, a fourth output and a fourth inverted output The fourth MVL selection circuit outputs a fourth binary clock signal having a logic level in accordance with the following table:

| the fourth<br>enable/clock input | the fourth data<br>input | the fourth<br>output | the fourth<br>inverted output |
|---|---|---|---|
| 0 | X | $Q_{prev}$ | $\overline{Q}_{prev}$ |
| 1 | X | $Q_{prev}$ | $\overline{Q}_{prev}$ |
| 2 | X | $Q_{prev}$ | $\overline{Q}_{prev}$ |
| 3 | 0 | 0 | 1 |
| 3 | 1 | 1 | 0 |

Yet another embodiment of the present invention provides an integrated circuit having a MVL clock generator, a single MVL clock signal distribution network connected to the MVL clock generator, a first MVL selection circuit having a first enable/clock input connected to the single MVL clock signal distribution network, a second MVL selection circuit having a second enable/clock input connected to the single MVL clock signal distribution network, a third MVL selection circuit having a third enable/clock input connected to the single MVL clock signal distribution network, and a fourth MVL selection circuit having a fourth enable/clock input connected to the single MVL clock signal distribution network. The MVL clock generator generates a MVL clock signal comprising a first MVL level, a second MVL level, a third MVL level and a fourth MVL level. The first MVL selection circuit also has a first data input and a first output. The first MVL selection circuit outputs a first binary clock signal via the first output having: (a) a first logic level whenever the MVL clock signal is equal to the first MVL level and the first data input receives the first logic level, (b) a second logic level whenever the MVL clock signal is equal to the first MVL level and the first data input receives the second logic level, and (c) a previous logic level of the first binary clock signal whenever the MVL clock signal is not equal to the first MVL level. One or more first sub-circuits are connected to the first output of the first MVL selection circuit. The second MVL selection circuit also has a second data input and a second output. The second MVL selection circuit outputs a second binary clock signal via the second output having: (a) a first logic level whenever the MVL clock signal is equal to the second MVL level and the second data input receives the first logic level, (b) a second logic level whenever the MVL clock signal is equal to the second MVL level and the second data input receives the second logic level, and (c) a previous logic level of the second binary clock signal whenever the MVL clock signal is not equal to the second MVL level. One or more second sub-circuits are connected to the first output of the first MVL selection circuit. The third MVL selection circuit also has a third data input and a third output. The third MVL selection circuit outputs a third binary clock signal via the third output having: (a) a first logic level whenever the MVL clock signal is equal to the third MVL level and the third data input receives the first logic level, (b) a second logic level whenever the MVL clock signal is equal to the third MVL level and the third data input receives the second logic level, and (c) a previous logic level of the third binary clock signal whenever the MVL clock signal is not equal to the third MVL level. One or more third sub-circuits are connected to the first output of the first MVL selection circuit. The fourth MVL selection circuit also has a fourth data input and a fourth output. The fourth MVL selection circuit outputs a fourth binary clock signal via the fourth output having: (a) a first logic level whenever the MVL clock signal is equal to the fourth MVL level and the fourth data input receives the first logic level, (b) a second logic level whenever the MVL clock signal is equal to the fourth MVL level and the fourth data input receives the second logic level, and (c) a previous logic level of the fourth binary clock signal whenever the MVL clock signal is not equal to the fourth MVL level. One or more fourth sub-circuits are connected to the first output of the first MVL selection circuit.

Another embodiment of the present invention provides a method for generating a set of binary clock signals by generating a MVL clock signal having three or more MVL levels, transmitting the MVL clock signal to three or more MVL selection circuits using a single MVL clock signal distribution network, and receiving the MVL clock signal at each MVL selection circuit, wherein each MVL selection circuit corresponds to a specified MVL level selected from the three or more MVL levels. For each MVL selection circuit, a binary clock signal is output having (a) a first logic level whenever the MVL clock signal is equal to the specified MVL level and a data input receives the first logic level, (b) a second logic level whenever the MVL clock signal is equal to the specified MVL level and the data input receives the second logic level, and (c) a previous logic level of the binary clock signal whenever the MVL clock signal is not equal to the specified MVL level.

The present invention is described in detail below with reference to the accompanying drawings.

BRIEF DESCRIPTION OF THE DRAWINGS

The above and further advantages of the invention may be better understood by referring to the following description in conjunction with the accompanying drawings, in which.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention. The discussion herein relates primarily to a four-valued voltage-mode quaternary clock signal (i.e. four logic levels—logic 0, logic 1, logic 2 and logic 3), but it will be understood that the concepts of the present invention are applicable to any Multiple-Valued Logic (MVL) (three or more value) system. Note also that the logic levels can implemented as positive or negative voltages depending on the architecture of the integrated circuit.

The MVL-based method described herein implements the strategy of a multi-phase clocking architecture but utilizes a single clock distribution network instead of multiple clock distribution networks [14, 15]. The single clock distribution network contains a MVL clock signal propagating to all of the clocked storage elements present in the high-performance IC. The single network may be implemented as a single conductor that distributes an MV clock signal encoded as a set of discrete voltage levels, or as a set of log(N) conductors distributing a binary encoded version of the MV clock signal.

The present invention reduces the required area for multi-phase synchronous integrated circuit designs. Area reduction is achieved by replacing the N multiple clock distribution networks needed for each phase in a conventional approach with a single distribution network in an ASIC implementation or with $\log_2(N)$ networks for a binary implementation. The challenges with respect to timing closure due to large scale distribution of high-frequency clock signals will remain, however, the use of a more complicated clock signal is compensated for by a reduction in overall frequency and through the use of level-sensitive storage devices instead of edge-sensitive devices.

Binary level-sensitive latches are augmented to contain a modified literal selection gate inserted in-line between the MV clock signal input and the gating input of the latch. There are four different modified literal selection gates that correspond to one of each of the four clock phase domains. The output of the modified literal selection gate is a standard binary signal that produces a logic 1 for one of the four MV clock signal levels and a logic 0 otherwise.

Figure 5:
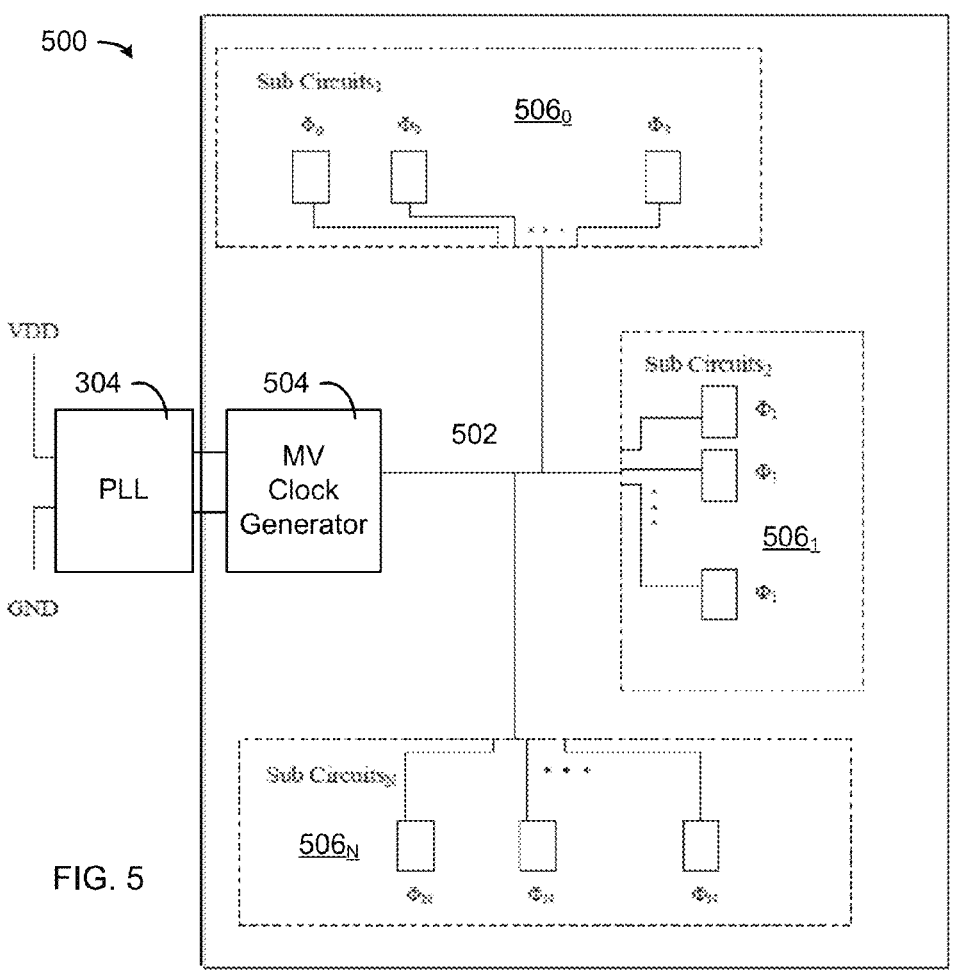
FIG. 5 is a block diagram of a multi-phase clock integrated circuit having a single MVL clock signal distribution network in accordance with one embodiment of the present invention.
Figure 6:
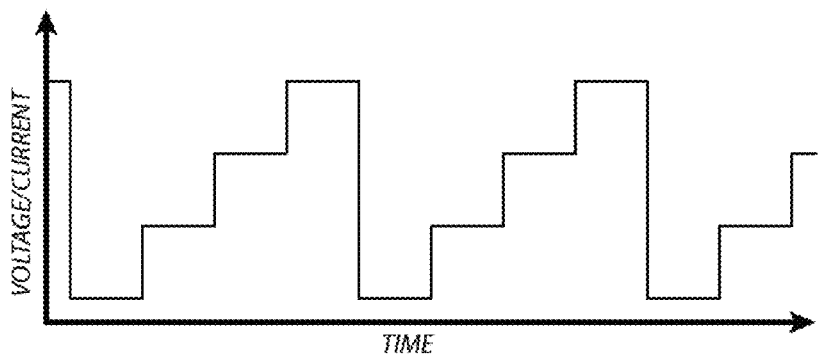
FIG. 6 is a graph of a MVL clock signal waveform in accordance with one embodiment of the present invention.
Figure 7A:
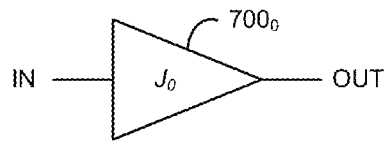
FIGS. 7A-7D are logic symbols for modified literal selection gates in accordance with one embodiment of the present invention.
Figure 7B:
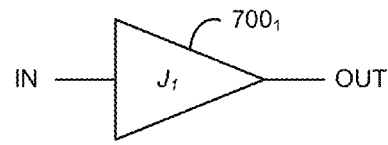
Figure 7C:
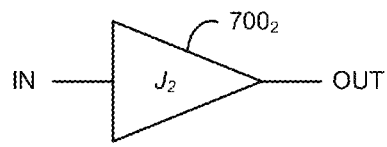
Figure 7D:
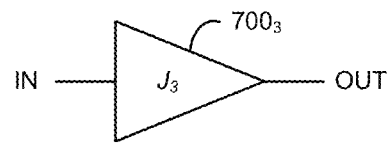
Figure 8A:
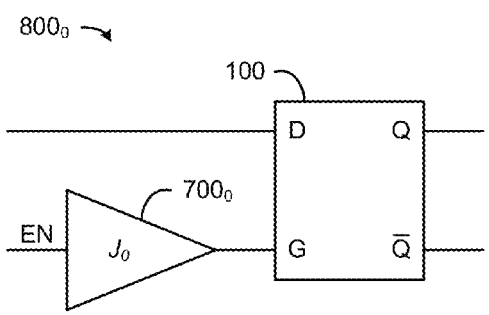
FIGS. 8A-8D are block circuit diagrams for MVL selection circuits (D-Latches with modified literal selection gates) in accordance with one embodiment of the present invention.
Figure 8B:
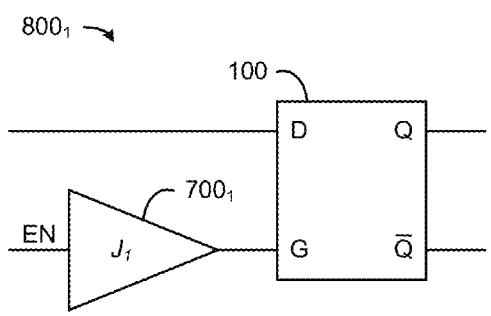
Figure 8C:
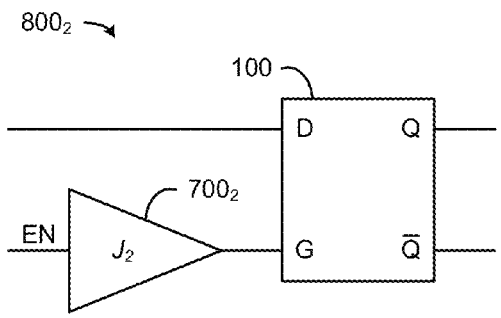
Figure 8D:
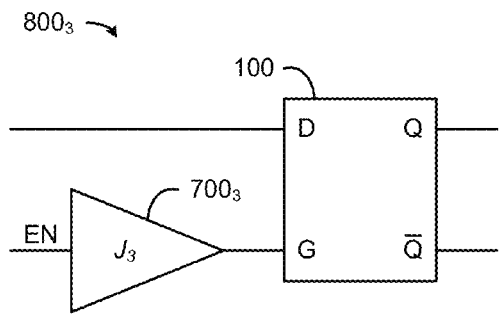

Now referring to FIG. 5, a block diagram of a multi-phase clock integrated circuit 500 having a single MVL clock signal distribution network 502 in accordance with one embodiment of the present invention. A MVL clock signal, represented by $\Phi_{clk}$, is generated from a MVL clock generator 504 and is propagated on a single clock distribution network 502 to all the sub-circuits 506$_0$, 506$_1$ and 506$_N$ present in the IC chip. The waveform for the MVL clock signal $\Phi_{clk}$ is shown in FIG. 6. The MVL clock generator 504 will likely still employ a PLL/DLL internally for edge alignment with an external source such as a VCXO but may not require a frequency multiplying divider since the overall period of the MVL clock signal will be reduced as compared to the binary square wave used in a conventional multi-phase design.

Figure 1:
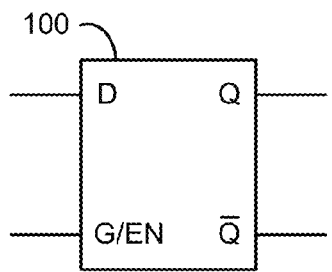
FIG. 1 is a logic symbol for a D-Latch in accordance with the prior art.

Each subinterval in the $\Phi_{clk}$ period in the waveform shown in FIG. 6 represents one of the four logic levels (logic 0, logic 1, logic 2, and logic 3) in a quaternary logic system. Since the level-sensitive latches present in FIG. 1 are designed for binary logic, a change in the latch design is essential for it to be compatible with the new MVL clock signal ($\Phi_{clk}$). The design change for the level-sensitive latches is implemented by inserting a modified literal selection gate in series with the latch gate or enable input.

One embodiment of the present invention provides a MVL circuit having a MVL clock generator 504, a single MVL clock signal distribution network 502 connected to the MVL clock generator 504, and three or more ith MVL selection circuits having an ith enable/clock input connected to the single MVL clock signal distribution network 502 where i=0 to N and N>=3. In one example, the three or more MVL selection circuits can be identified as a first MVL selection circuit, one or more intermediate MVL selection circuits, and a Nth MVL selection circuit. The MVL clock generator generates a MVL clock signal having three or more ith MVL levels (e.g., a first MVL level—logic 0, one or more intermediate MVL levels—logic 1, and a Nth MVL level—logic 2). Each ith MVL level typically corresponds to a specified voltage level. Each ith MVL selection circuit corresponds to a specified ith MVL level selected from the three or more ith MVL levels. The ith MVL selection circuit also has an ith data input and an ith output. The ith MVL selection circuit outputs an ith binary clock signal via the ith output having: (a) a first logic level (e.g., logic 0) whenever the MVL clock signal is equal to the ith MVL level and the ith data input receives the first logic level (e.g., logic 0), (b) a second logic level (e.g., logic 1) whenever the MVL clock signal is equal to the ith MVL level and the ith data input receives the second logic level (e.g., logic 1), and (c) a previous logic level of the ith binary clock signal whenever the MVL clock signal is not equal to the ith MVL level. Note that each ith MVL selection circuit typically also include an inverted ith output. One or more ith sub-circuits (e.g., sub-circuits $506_0$, $506_1$ and $506_N$) are connected to the ith output of the ith MVL selection circuit.

A Literal Selection Gate is a unary quaternary logic gate, denoted by $J_i$ [5]. The subscript i denotes the desired logic level for which the output of $J_i$ gate has a non-zero value. For a quaternary logic implementation, i can take values 0, 1, 2 and 3 representing the corresponding four logic levels. The $J_i$ logic symbols for the four different modified literal selection gates are shown in FIGS. 7A-7D.

Previous work defines the non-zero output of a quaternary $J_i$ gate to be logic 3. In the present invention, the structure of $J_i$ is modified such that the non-zero output of $J_i$ is a standard binary logic 1 chosen to represent the level-shifted output required to interface the MVL technology to the binary technology thus allowing for compatibility with existing multi-phase clock domain binary circuits. The use of a logic 1 output is arbitrary and here indicates that the modified literal selection gate may contain appropriate level-shifting circuitry to enable compatibility with conventional binary logic. The modified literal selection gate, $J_i$ is defined as shown in the truth table in Table 2.

TABLE 2

Truth Table for Modified $J_i$

| IN\OUT | $J_0$ | $J_1$ | $J_2$ | $J_3$ |
|---|---|---|---|---|
| 0 | 1 | 0 | 0 | 0 |
| 1 | 0 | 1 | 0 | 0 |
| 2 | 0 | 0 | 1 | 0 |
| 3 | 0 | 0 | 0 | 1 |

Figure 3:
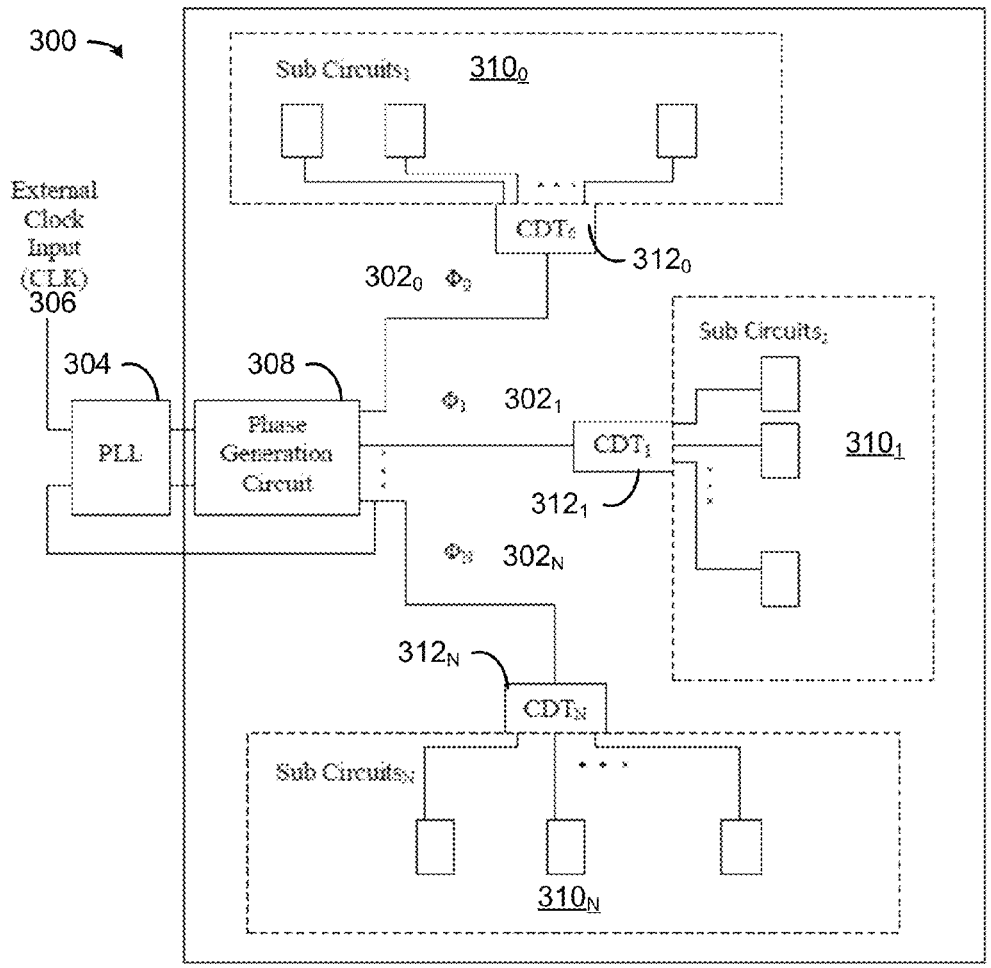
FIG. 3 is a block diagram of a multi-phase clock integrated circuit in accordance with the prior art.
Figure 4:
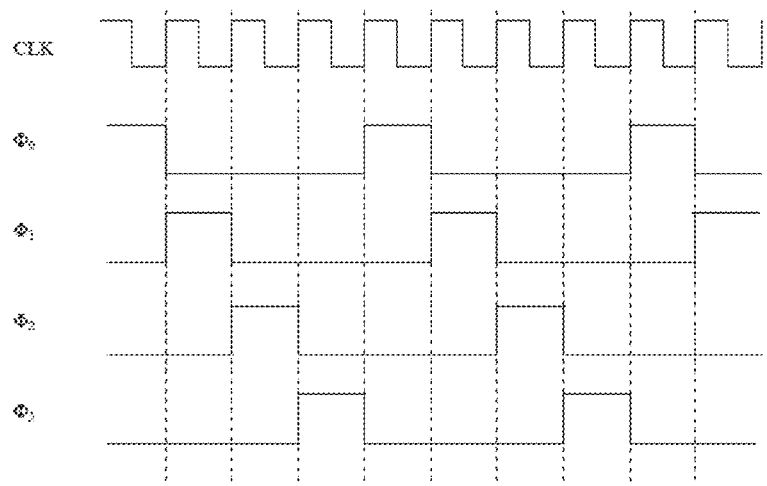
FIG. 4 is a graph of the clock-phase waveforms for a multi-phase clock integrated circuit in accordance with the prior art.

To generate the MV global clock signal for a multi-phase clock domain circuit, the PLL and phase generation circuit shown in FIG. 3 are replaced by a subcircuit labeled MVL clock generator 504 as shown in FIG. 5. The individual CDT distribution networks $312_1$, $312_2$ and $312_N$ are replaced with a single global MV clock signal distribution network 502 and an appropriate modified literal selection circuit is inserted in series with the EN input of the transparent D-latches (see FIGS. 8A-8D). Area savings results in a custom or standard cell implementation through the replacement of the multiple CDT networks with a single clock distribution network since routing and via placement is less complex.

Depending on which CDT domain is used, each original D-latch 100 is a member of one of the four MVL selection circuits $800_0$, $800_1$, $800_2$ and $800_3$ shown in FIGS. 8A-8D. These MVL selection circuits $800_0$, $800_1$, $800_2$ and $800_3$ are effectively implemented as the insertion of a modified literal selection gate $700_0$, $700_1$, $700_2$ and $700_3$ in series with the D-latch 100 gate inputs (EN).

Based on the foregoing, an ith MVL selection circuit includes an ith modified literal selection gate connected to an ith level sensitive latch where i=0 to N. The first enable/clock input of the ith MVL selection circuit is the input of the ith modified literal selection gate. The first data input of the ith MVL selection circuit is the input of the ith level sensitive latch. The first output of the ith MVL selection circuit is the output of the ith level sensitive latch. The output of the ith modified literal selection gate is connected to the enable/clock input of the ith level sensitive latch. The ith modified literal selection gate outputs (1) the first logic level (e.g., logic 0) whenever the MVL clock signal is not equal to the ith MVL level and (2) the second logic level (e.g., logic 1) whenever the MVL clock signal is equal to the ith MVL level.

The overall characteristic tables for the four different MVL selection circuits in FIGS. 8A-8D are shown in Tables 3A-3D.

TABLE 3A

MVL Selection Circuit $800_0$

| EN/CLK | D | Q | $\overline{Q}$ |
|---|---|---|---|
| 0 | 0 | 0 | 1 |
| 0 | 1 | 1 | 0 |
| 1 | X | $Q_{prev}$ | $\overline{Q}_{prev}$ |
| 2 | X | $Q_{prev}$ | $\overline{Q}_{prev}$ |
| 3 | X | $Q_{prev}$ | $\overline{Q}_{prev}$ |

TABLE 3B

MVL Selection Circuit $800_1$

| EN/CLK | D | Q | $\overline{Q}$ |
|---|---|---|---|
| 0 | X | $Q_{prev}$ | $\overline{Q}_{prev}$ |
| 1 | 0 | 0 | 1 |
| 1 | 1 | 1 | 0 |
| 2 | X | $Q_{prev}$ | $\overline{Q}_{prev}$ |
| 3 | X | $Q_{prev}$ | $\overline{Q}_{prev}$ |

TABLE 3C

MVL Selection Circuit $800_2$

| EN/CLK | D | Q | $\overline{Q}$ |
|---|---|---|---|
| 0 | X | $Q_{prev}$ | $\overline{Q}_{prev}$ |
| 1 | X | $Q_{prev}$ | $\overline{Q}_{prev}$ |
| 2 | 0 | 0 | 1 |
| 2 | 1 | 1 | 0 |
| 3 | X | $Q_{prev}$ | $\overline{Q}_{prev}$ |

TABLE 3D

MVL Selection Circuit $800_3$

| EN/CLK | D | Q | $\overline{Q}$ |
|---|---|---|---|
| 0 | X | $Q_{prev}$ | $\overline{Q}_{prev}$ |
| 1 | X | $Q_{prev}$ | $\overline{Q}_{prev}$ |
| 1 | X | $Q_{prev}$ | $\overline{Q}_{prev}$ |
| 3 | 0 | 0 | 1 |
| 3 | 1 | 1 | 0 |

Another embodiment of the present invention provides a multi-valued logic circuit a MVL clock generator, a single MVL clock signal distribution network connected to the MVL clock generator, a first MVL selection circuit having a first enable/clock input connected to the single MVL clock signal distribution network, a second MVL selection circuits having a second enable/clock input connected to the single MVL clock signal distribution network, a third MVL selection circuit having a third enable/clock input connected to the single MVL clock signal distribution network, and a fourth MVL selection circuit having a fourth enable/clock input connected to the single MVL clock signal distribution network. The MVL clock generator generates a MVL clock signal comprising a logic 0, a logic 1, a logic 2 and a logic 3. The first MVL selection circuit also has a first data input, a first output and a first inverted output. The first MVL selection circuit outputs a first binary clock signal having a logic level in accordance with Table 3A where X=logic 0 or logic 1, $Q_{prev}$=a previous logic level of the first binary clock signal, and $Q'_{prev}$=an inverse value of the previous logic level of the first binary clock signal. The second MVL selection circuit also has a second data input, a second output and a second inverted output The second MVL selection circuit outputs a second binary clock signal having a logic level in accordance with Table 3B. The third MVL selection circuit also has a third data input, a third output and a third inverted output. The third MVL selection circuit outputs a third binary clock signal having a logic level in accordance with Table 3C. The fourth MVL selection circuit also has a fourth data input, a fourth output and a fourth inverted output The fourth MVL selection circuit outputs a fourth binary clock signal having a logic level in accordance with the following table Table 3D.

Figure 9:
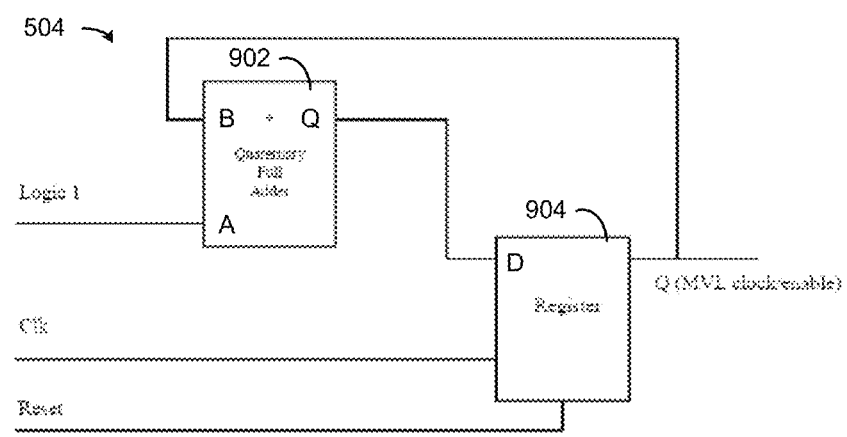
FIG. 9 is a block diagram of a MVL clock/enable generator in accordance with one embodiment of the present invention.

The master MVL clock generation circuit 504 is the second additional circuit that must be implemented in place of the traditional phase generation circuits 308. An example of a simple implementation of the MV clock generation circuit 504 is comprised of a MV incrementing circuit with a MV registered output as shown in FIG. 9. It is anticipated that such a design would require a PLL or DLL to edge align the Clk signal driving the counter, although it may not be necessary to configure the PLL/DLL such that clock frequency multiplication is performed. Other implementations are certainly possible and will depend upon the target fabrication technology. Some of these include the use of comparators in conjunction with a sawtooth waveform generator or analog switches and sample- and hold-circuits. Other implementation tradeoffs for the MV clock generator involve choosing between additional voltage supplies and distributions if ranges exceed that of [Vss, Vdd] or the use of circuitry that restrict the clock signal to the range [Vss, Vdd]. Such implementations will depend upon the target fabrication technology and application where considerations such as allowable noise margins must be considered. While the method described here will increase the area of the clock generation circuitry, these increases will be offset through a reduction in area due to the use of a single or $\log_2(N)$ clock distribution networks As shown in FIG. 9, the MVL clock generation circuit 504 includes a register 900 and a N full adder circuit 902, which is a quaternary full adder (N=4) in this example. The register 900 has a clock input (Clk), a reset input (Reset), a data input (D) and an output (Q (MVL clock/enable). The N full adder circuit 904 has a first input (A) that receives the first logic level (e.g., logic 1), a second input (B) connected to the output (Q) of the register 900, an output (Q) connected to the data input (D) of the register 900. In operation, a reset signal sent to the reset input (Reset) of the register 900 initializes the output (Q) of the register 900 to logic 0. The N full adder circuit 902 increments a logic level stored in the register 900. The register 900 stores the result of the N full adder circuit and the output (Q) of the register 900 outputs a logic level sequence from logic 0 to logic N−1, which is 0, 1, 2, 3 in this example.

When the implementation technology target is a commercially available programmable device such as an FPGA or a standard cell ASIC with a binary logic library, existing logic cell structures must be employed. This restriction prevents the incorporation of the modified literal selection gate 700 and the MV clock generation circuit 504 as described above. The following description shows how the method may be modified such that implementation using such devices is possible through use of a binary-encoded MV clock signal. The use of binary encodings for MVL-based implementations has been used in other applications [21].

Most commercially available FPGAs contain resources to support a single binary clock distribution network. When a multi-phase clock domain design is required, the tools must route the different CDT networks using on-chip routing resources. This is often inefficient and requires the use of multiple programmable interconnects which in turn can severely impact performance since the delay added by the programmable interconnects can be significant. For this reason, the use of FPGA target technologies that can take advantage of multi-phase clock domain designs while not suffering from undue clock signal delays due to the heavy use of programmable interconnects in the distribution of the multiple CDT networks. This modification is also applicable for standard cell designs where the inclusion of custom analog cells is not permitted.

Because the MV clock generator 504 cannot be easily implemented on most available FPGAs, an intermediate approach is used where the N CDT networks of a traditional multi-phase clock domain IC are replaced by log(N) CDTs that are routed within the FPGA. Here, log(N) refers to the logarithm base-2 of the value N. The log(N) CDT networks transmit a binary-encoded version of the MV clock signal $\Phi_{clk}$. In such a case, the MVL clock generator is a binary encoded MVL clock generator (e.g., a binary counter that cycles through the clock phase values) that generates a binary encoded clock signal corresponding to the first MVL level, the one or more intermediate MVL levels and the Nth MVL level. For the example of a quaternary design, the single MVL clock signal distribution network is a first binary clock line (A) and a second binary clock line (B). The first and second binary signals, labeled A and B, are propagated to each storage cell that cycle through the values of 00, 01, 10, and 11. Each clock value is the binary encoded representation of the global MV clock signal $\Phi_{clk}$. The MV clock generator 504 can then be implemented as a binary counter that cycles through the various clock phase values.

Figure 10:
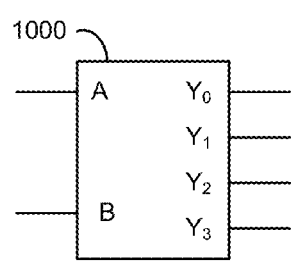
FIG. 10 is a logic symbol for a decoder in accordance with one embodiment of the present invention.
Figure 11A:
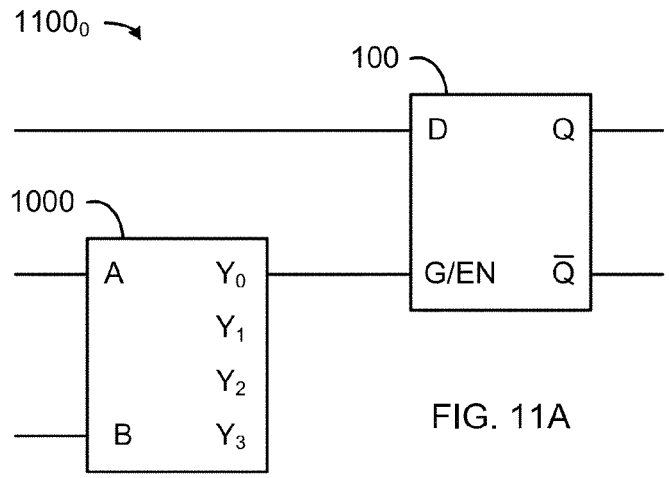
FIG. 11A-11D are block diagrams for MVL selection circuits (D-Latches with decoders) in accordance with another embodiment of the present invention.
Figure 11B:
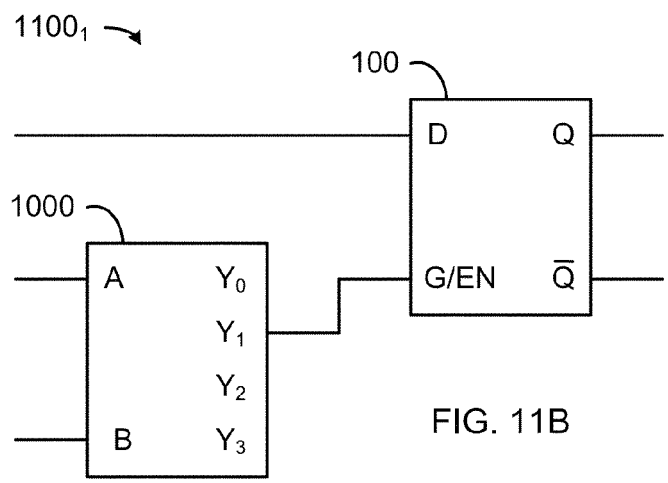
Figure 11C:
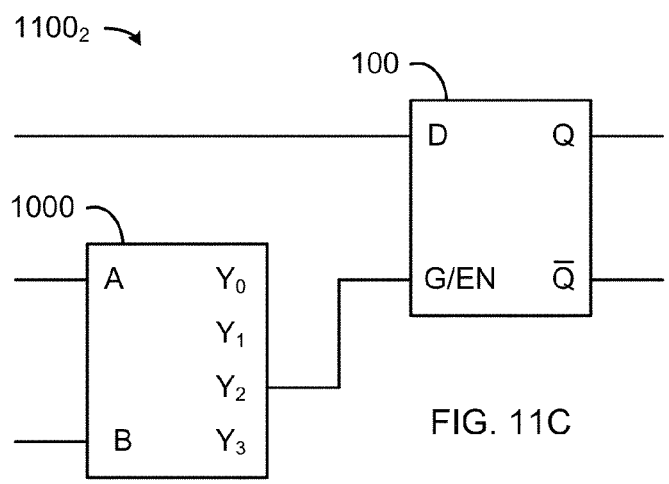
Figure 11D:
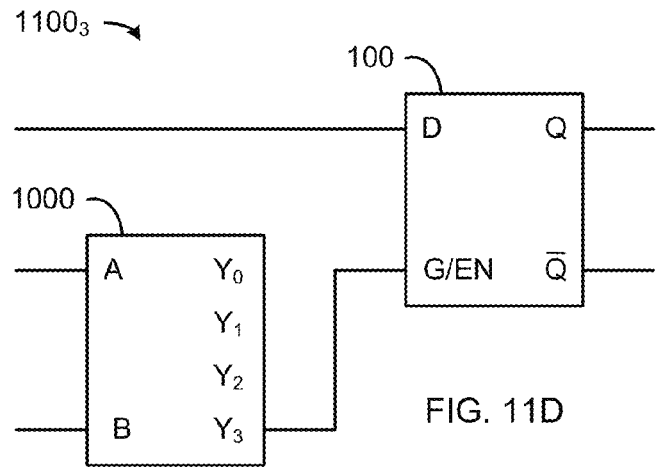

Also, in commercially available FPGAs, it is not possible to insert a modified literal selection gate 700 in series with each storage device 100. Instead of a modified literal election gate 700, a binary decoding circuit 1000 is inserted that receives the encoded global clock signal as inputs A and B and produces an output enabling binary pulse. As shown in FIG. 10, the decoder 1000 (e.g., 2×4) has a first input (A) for receiving the first binary signal, a second input (B) for receiving the second binary signal, and one or more outputs (e.g., $Y_0, Y_1, Y_2$ and $Y_3$). The 2:4 decoder 1000 truth table is shown in Table 4.

TABLE 4

Truth Table for 2:4 Decoder

| A | B | $Y_0$ | $Y_1$ | $Y_2$ | $Y_3$ |
|---|---|---|---|---|---|
| 0 | 0 | 1 | 0 | 0 | 0 |
| 0 | 1 | 0 | 1 | 0 | 0 |
| 1 | 0 | 0 | 0 | 1 | 0 |
| 1 | 1 | 0 | 0 | 0 | 0 |

As shown in FIG. 11A-11D, the MVL selection circuits are configured by connecting the appropriate output (e.g., $Y_0, Y_1, Y_2$ and $Y_3$) of decoder 1000 to the latch 100 gate input (EN). The particular decoder output used is based upon the particular phase domain of the original design. Although, an entire decoder 1000 is shown in FIG. 10, this is for illustrative purposes only. Note that his approach does not require the implementation of custom MVL sub-circuits, but does require more clock distribution network area.

Figure 12A:
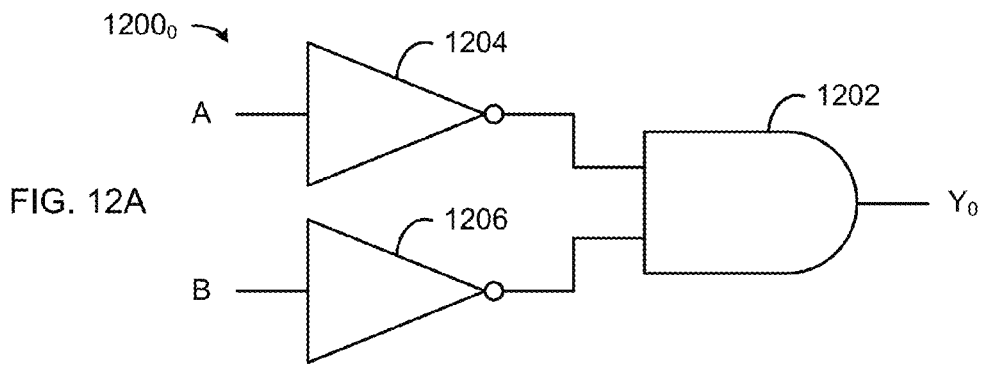
FIGS. 12A-12D are block diagrams for simplified decoders in accordance with another embodiment of the present invention.
Figure 12B:
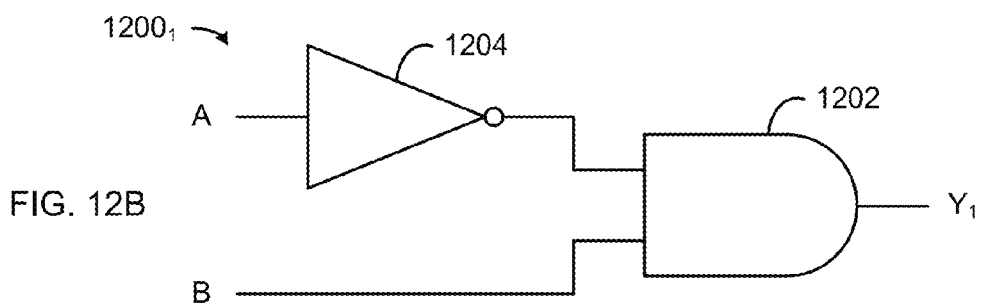
Figure 12C:
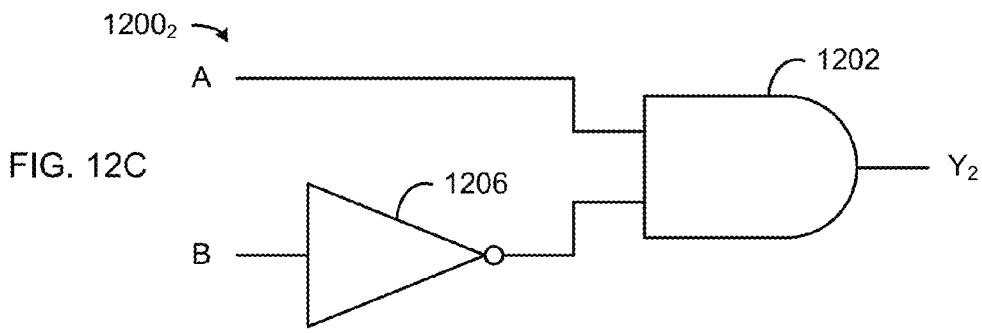
Figure 12D:
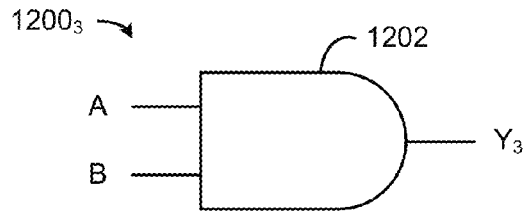

Since each latch 100 responds to a particular clock phase only, a more economical implementation would be the use of a two-input binary AND gate with input inverters that select the appropriate clock phase as shown in FIGS. 12A-12D. FIG. 12A shows the decoder $1200_0$ with an output $Y_0$ implemented as an AND gate 1202 having a first inverter 1204 connected in series with the first input (A) of the AND gate 1202 and a second inverter 1206 connected in series with the second input (B) of the AND gate 1202. FIG. 12B shows the decoder $1200_1$ with an output $Y_1$ implemented as the AND gate 1202 having the first inverter 1204 connected in series with the first input (A) of the AND gate 1202. FIG. 12C shows the decoder $1200_2$ with an output $Y_2$ implemented as the AND gate 1202 having the second inverter 1206 connected in series with the second input (B) of the AND gate 1202. FIG. 12D shows the decoder $1200_3$ with an output $Y_3$ implemented as the AND gate 1202. Note that two-input binary NAND gates can also be used with input inverters.

Figure 13:
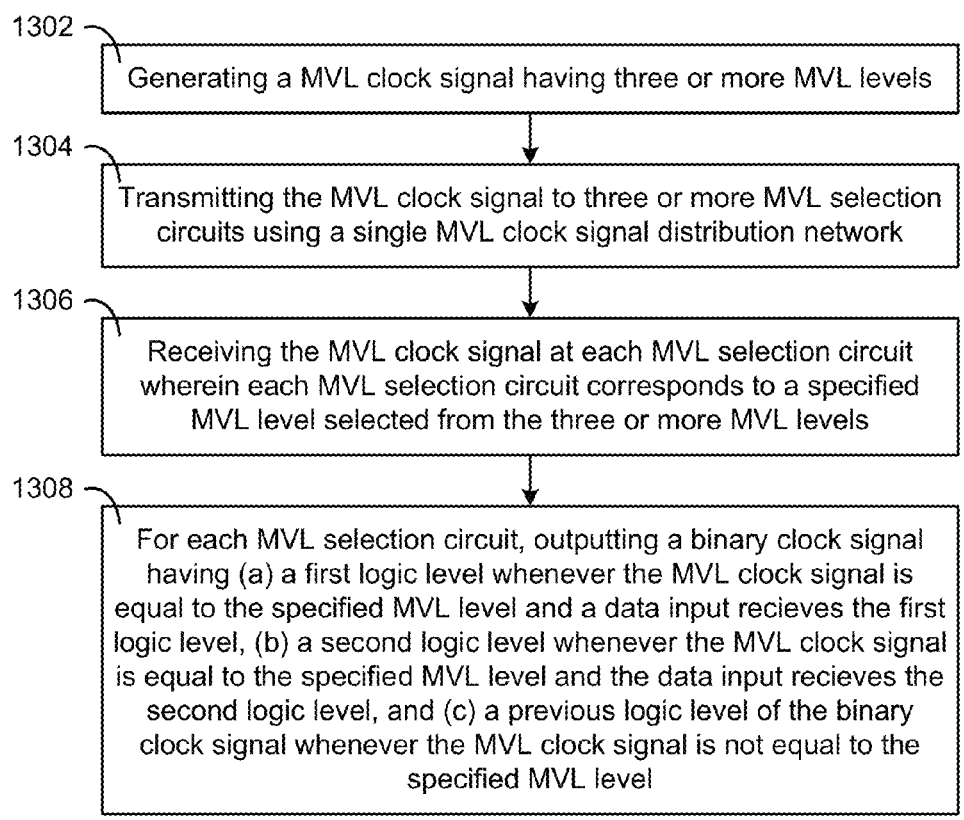
FIG. 13 is a flow chart of a method for generating a set of binary clock signals in accordance with one embodiment of the present invention.

Now referring to FIG. 13, a flow chart depicts a method 1300 for generating a set of binary clock signals in accordance with another embodiment of the present invention. A MVL clock signal having three or more MVL levels is generated in block 1302. The MVL clock signal is transmitted to three or more MVL selection circuits using a single MVL clock signal distribution network in block 1304. The MVL clock signal is received at each MVL selection circuit in block 1306. Each MVL selection circuit corresponds to a specified MVL level selected from the three or more MVL levels. For each MVL selection circuit, a binary clock signal is output in block 1308. The binary clock signal has (a) a first logic level whenever the MVL clock signal is equal to the specified MVL level and a data input receives the first logic level, (b) a second logic level whenever the MVL clock signal is equal to the specified MVL level and the data input receives the second logic level, and (c) a previous logic level of the binary clock signal whenever the MVL clock signal is not equal to the specified MVL level.

Three different types of experiments were carried out to validate the present invention. The modified literal selection gates 700 were designed and implemented at the transistor level, several multi-phase clock domain synchronous circuits were implemented and functionally validated at the RTL level, and several different circuits were designed and implemented using FPGA target technology as described above.

Figure 14A:
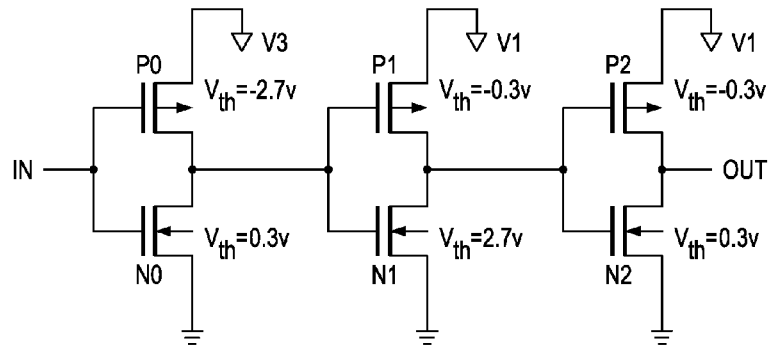
FIGS. 14A-14D are circuit diagrams for the four literal selection gates in accordance with another embodiment of the present invention.
Figure 14B:
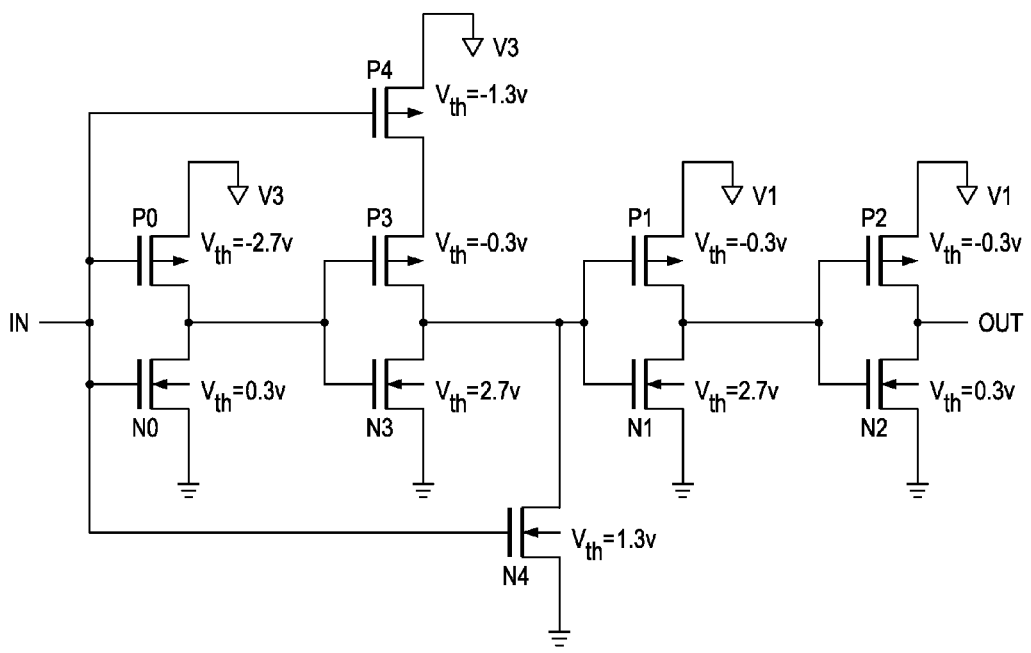
Figure 14C:
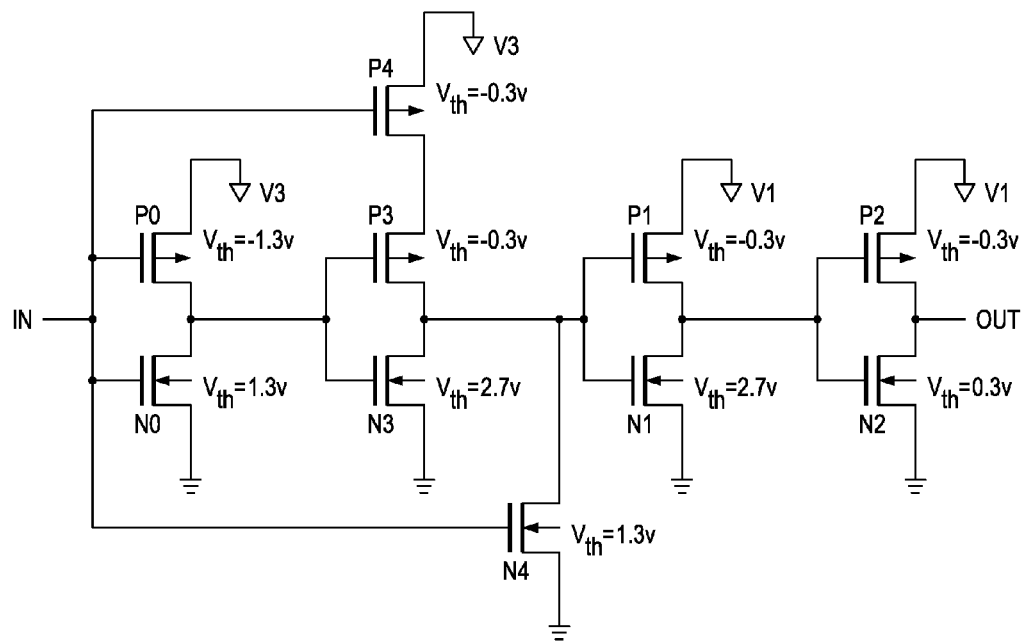
Figure 14D:
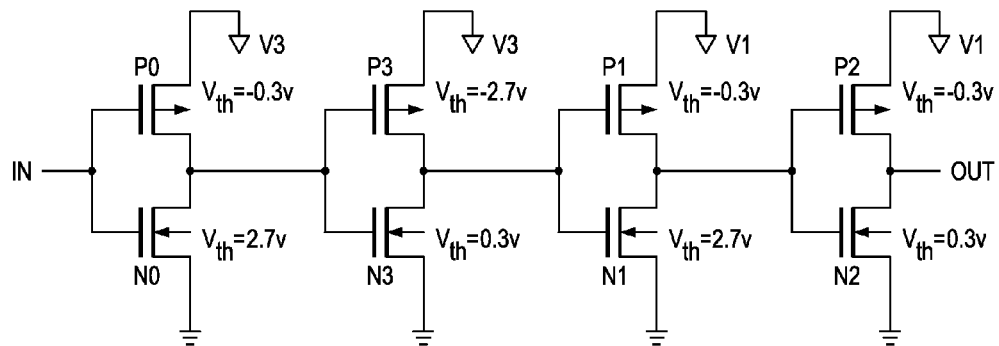

The modified literal selection gates 700 were designed at the transistor level and simulated using HSPICE. In this experiment, multi-threshold field effect transistor (FET) models reported in [12] were used allowing for different threshold voltages to control the switching. Each FET can assume different threshold voltage levels ($V_{th}$) based on the design requirement which implies different doping levels for each transistor during their fabrication. The transistors P1, P2, N1 and N2 present in all the transistor level designs of modified literal selection gates shown in FIGS. 15A-D restricts the non-zero output value of the gate to be a logic 1 representing the appropriate level shifted output required for interfacing to standard binary logic circuitry. V0, V1, V2 and V3 represent the four different voltage levels. The threshold voltages of the transistors are determined such that the structure shows the desired quaternary operation. The circuitry with P1, P2, N1 and N2 transistors essentially represents a buffer circuit. Except for the buffer circuit, the structure of $J_0$ resembles the static-CMOS binary inverter circuit and structure of $J_3$ is a series connection of two $J_0$ structures. The structures of $J_1$ and $J_2$ are similar and it differs only in the threshold voltages chosen for the transistors. FIGS. 14A-14D contain circuit diagrams for the four literal selection gates: modified $J_0$ circuit (FIG. 14A), modified $J_1$ circuit (FIG. 14B), modified $J_2$ circuit (FIG. 14C), and modified $J_3$ circuit (FIG. 14D).

Figure 2:
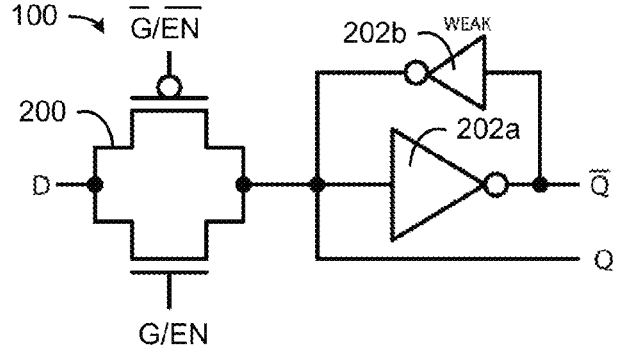
FIG. 2 is a block circuit diagram for a typical voltage-mode D-Latch in accordance with the prior art.

To evaluate the viability of implementation of the clock phase sensitive latches, the circuits were designed to consist of the four literal selection gate shown in FIGS. 14A-14D whose outputs drive the gate input of the D-latch shown in FIG. 2. These circuits were then simulated using HSPICE and transient analysis was performed using the AVANWAVES visualization tool.

Figure 15A:
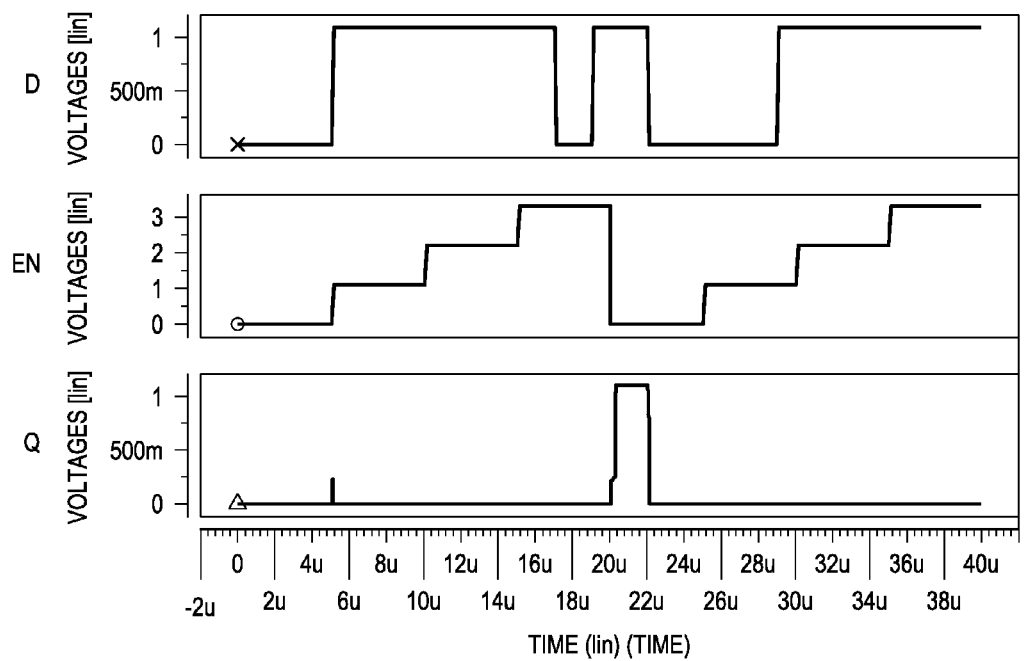
FIGS. 15A-15D are graphs showing a HSPICE simulation of the modified D-latches of FIGS. 8A-8D in accordance an embodiment of the present invention.
Figure 15B:
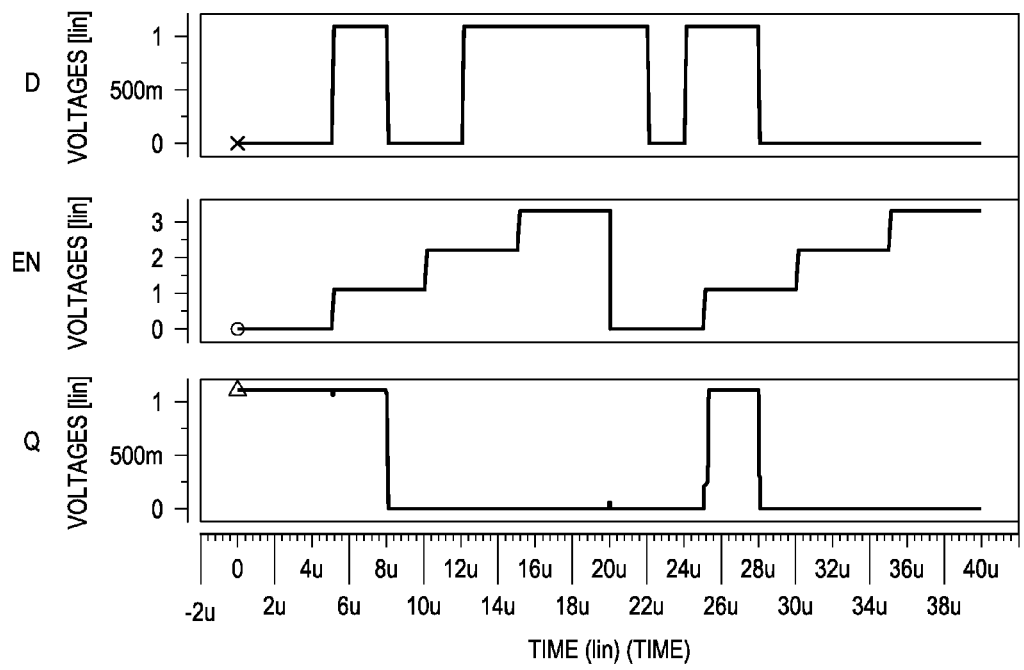
Figure 15C:
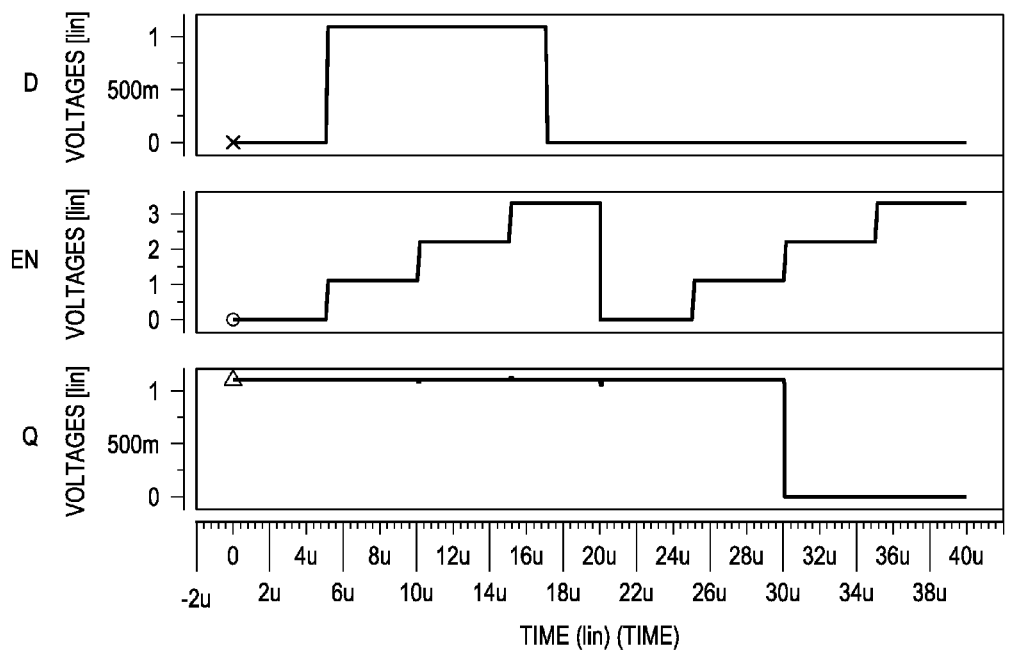
Figure 15D:
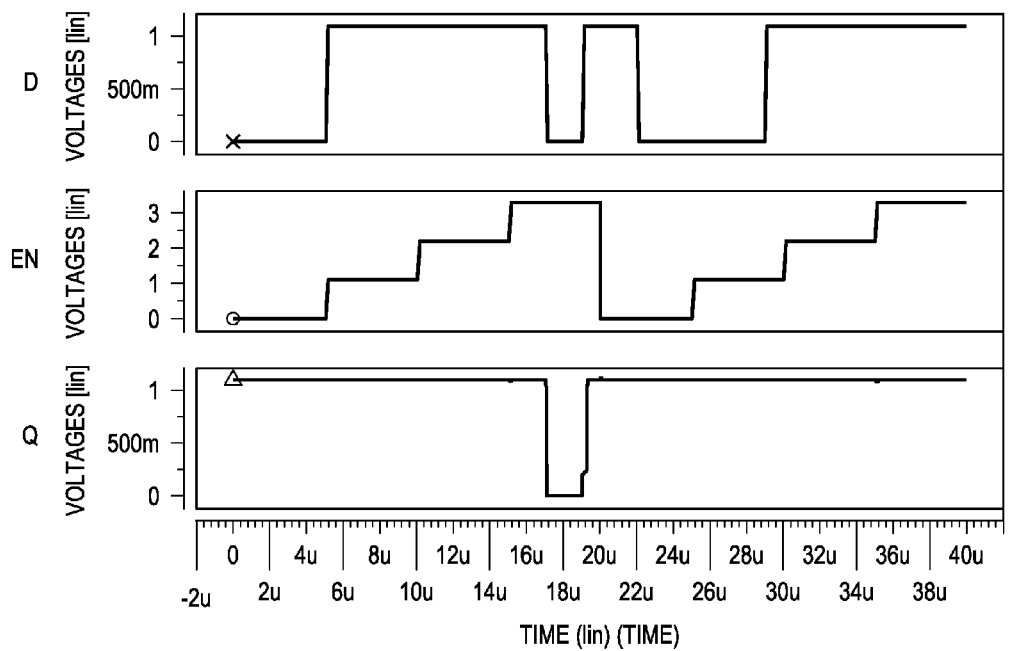

The HSPICE simulation results of the modified D-latches from FIGS. 8A-8D are shown in FIGS. 15A-15D: D-latch-0 simulation (FIG. 15A), D-latch-1 simulation (FIG. 15B), D-latch-2 simulation (FIG. 15C), and D-latch-3 simulation (FIG. 15D). Each D-latch-i logic circuit demonstrates transparent behavior when the EN input signal is at logic i and the previous D input value is latched for rest of the logic values, logic 1, logic 2 and logic 3, on the EN input signal.

From a functional point of view, RTL descriptions of several multiphase clock domain circuits were implemented and simulated. The SystemVerilog HDL is used in the functional simulations since it supports extended data types that allow for non-binary, higher-valued radix discrete signals to be easily represented. In these simulations, the MV clock generator circuit 504 was modeled based on the structure shown in FIG. 9 using the quaternary adder design reported in [12]. The modified literal selection gates 700 were modeled using a simple case construct and all other circuitry was identical to that in the original multiple CDT network designs.

Figure 16A:
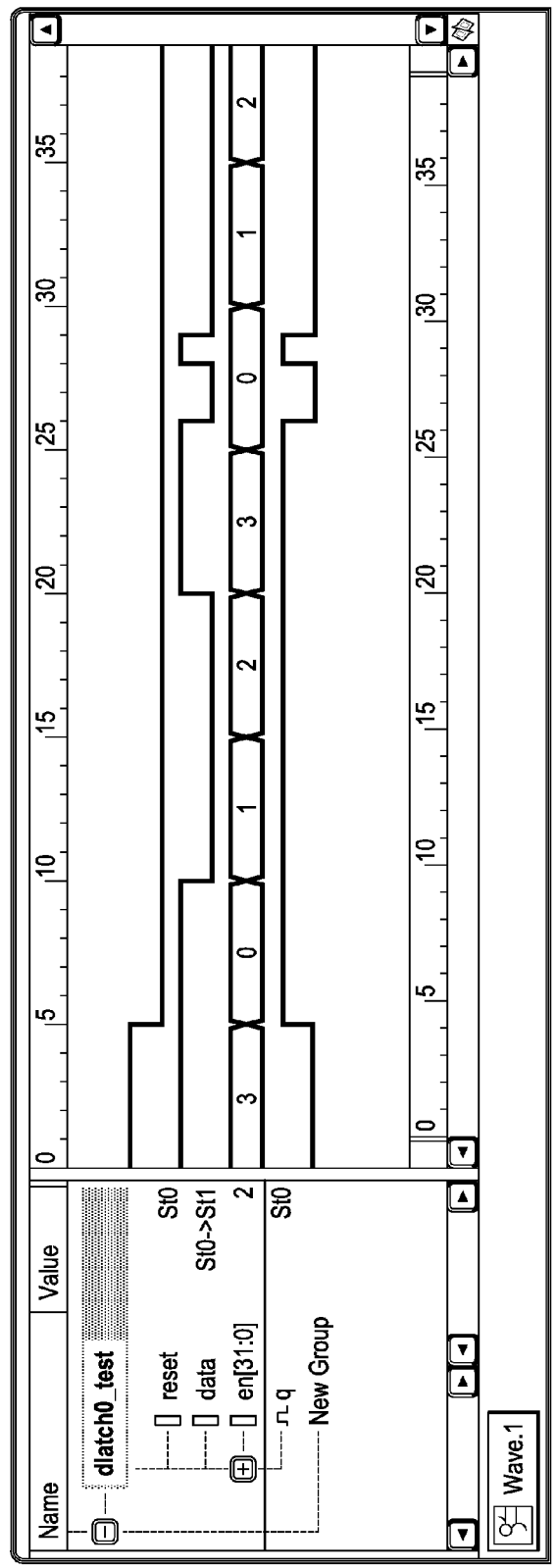
FIGS. 16A-16D are screen shots showing a functional simulation of the modified D-latches of FIGS. 8A-8D in accordance with an embodiment of the present invention.
Figure 16B:
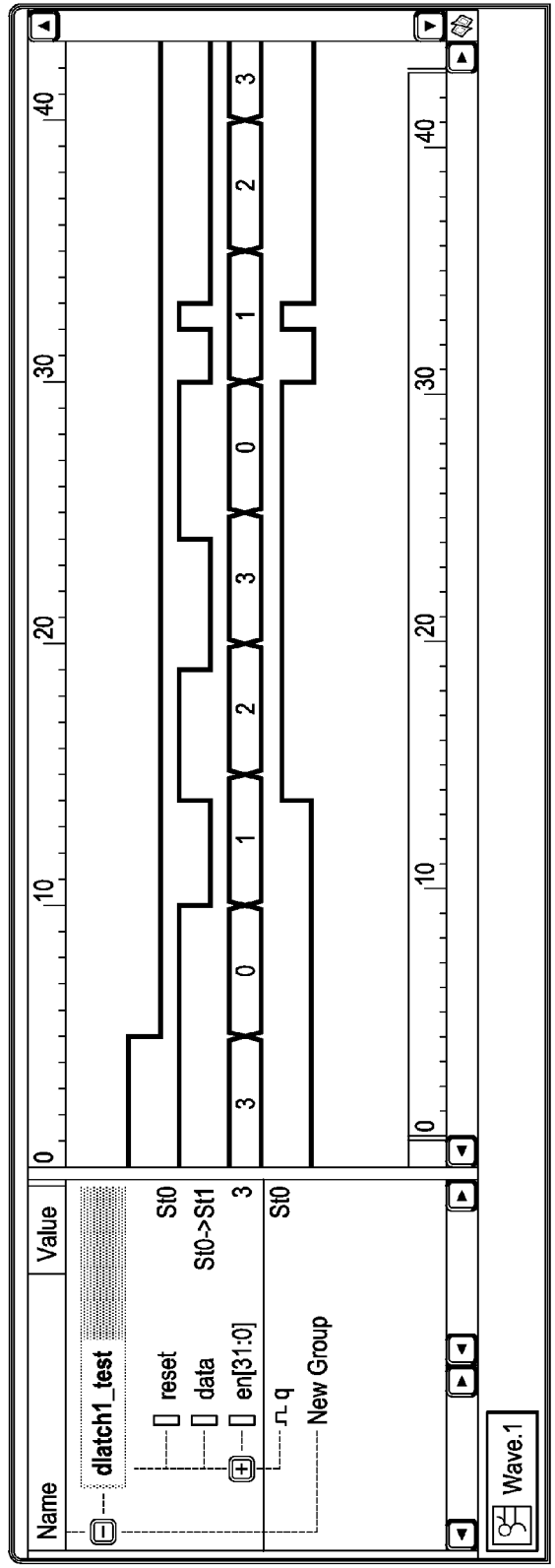
Figure 16C:
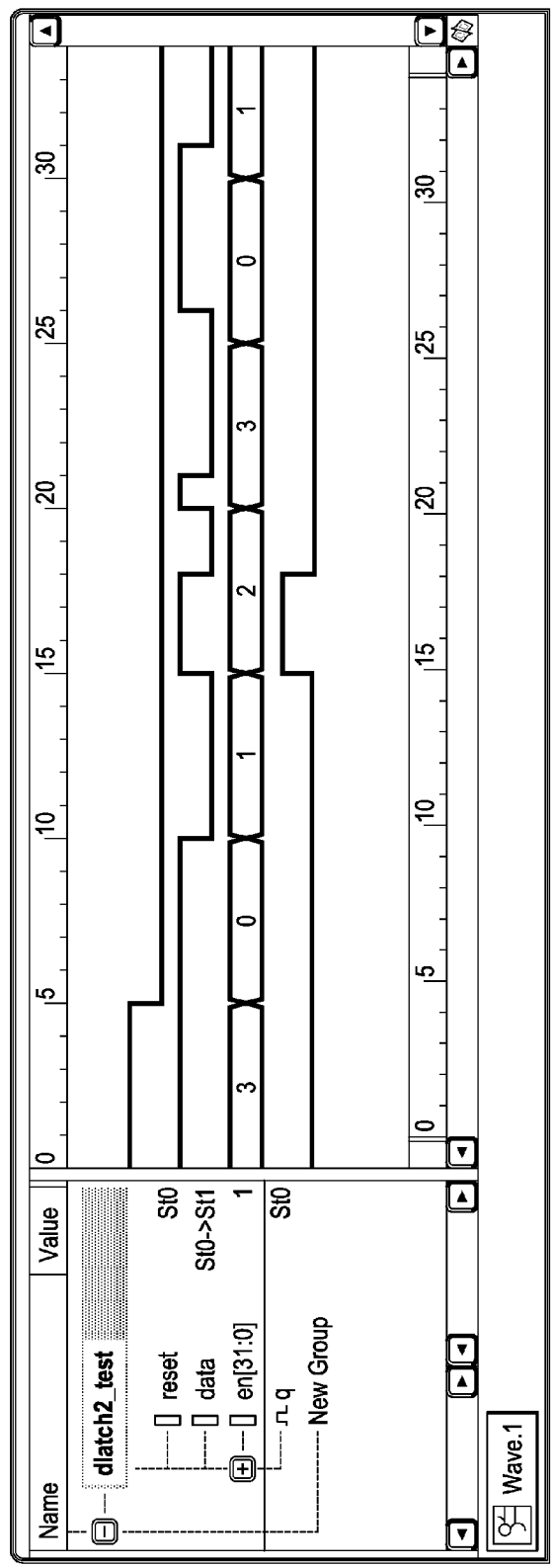
Figure 16D:
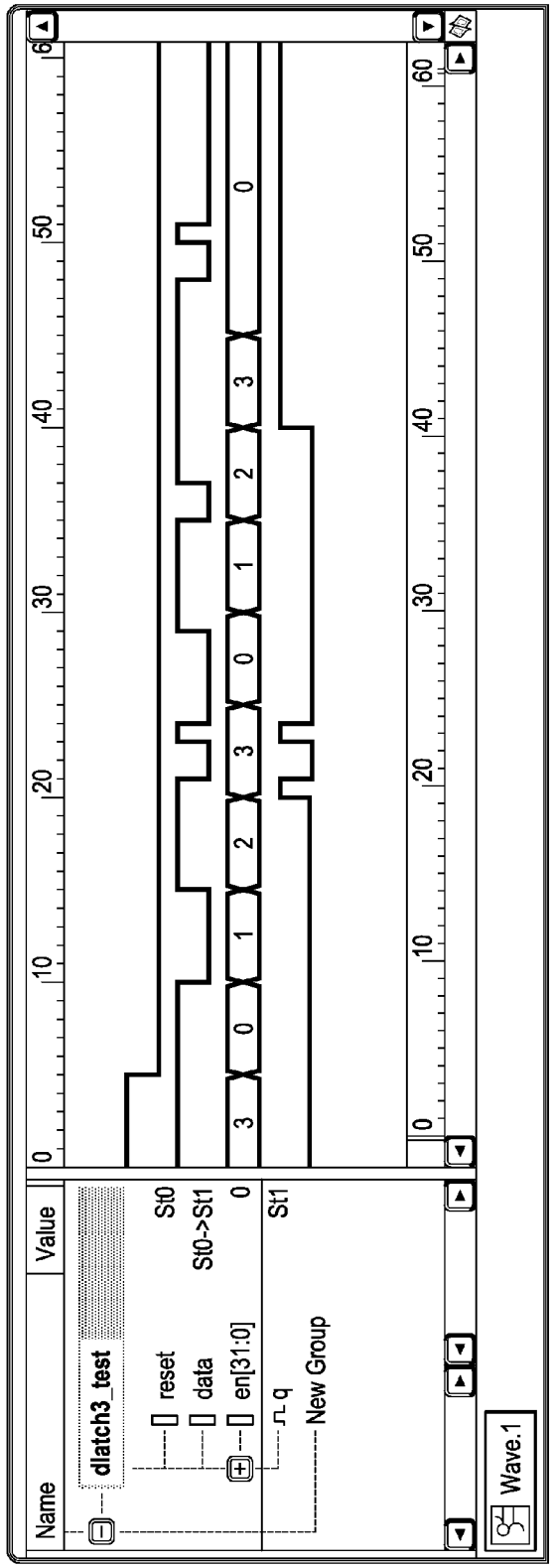
Figure 17:
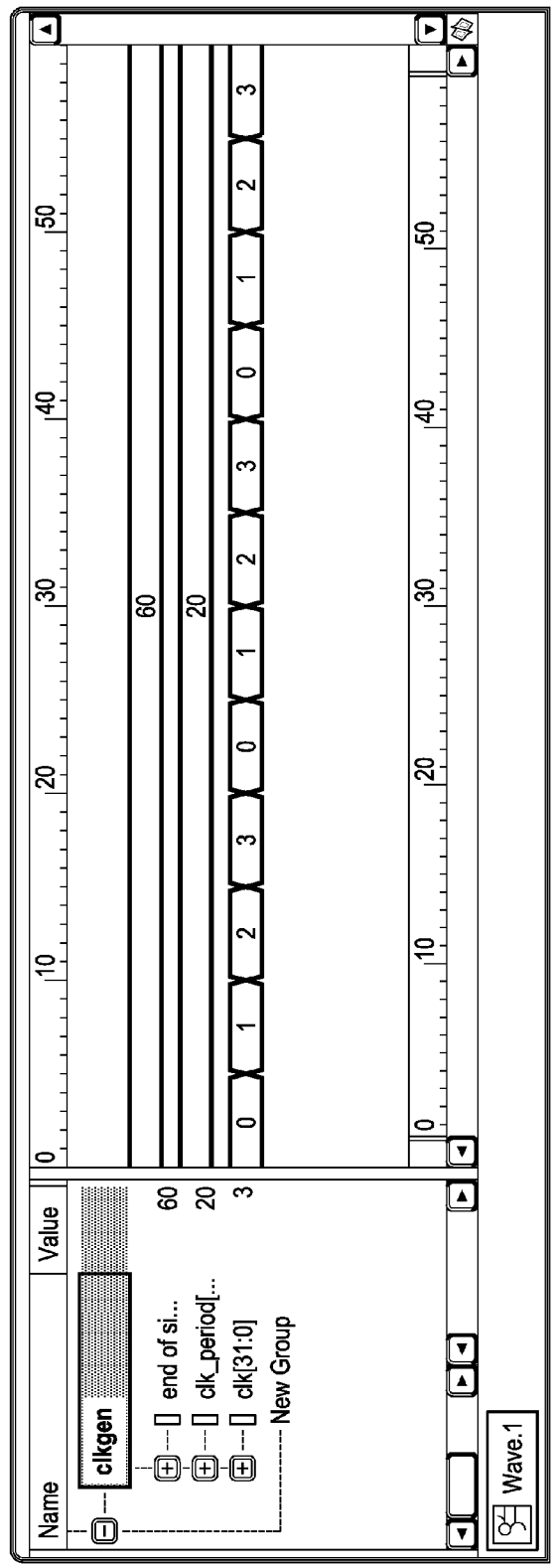
FIG. 17 is a screen shot showing a functional simulation of the MV clock generator in accordance with an embodiment of the present invention.

The 'Clk' signal supplied to the register 900 in FIG. 9 is a periodic binary pulse train. The 'Reset' signal initializes the output (Q) of the register 900 to be logic 0. For every positive edge of the binary clock (Clk), the register 900 stores the result of the quaternary full adder circuit 902. Hence, the output (Q) will take values in the sequence 0, 1, 2, 3, 0, 1, 2, 3, 0, 1 . . . which acts as the MVL clock/enable signal for the control of the MVL selection circuits 800 (D-latches 100 with modified literal selection gates 700). All simulations of SystemVerilog models were performed using Synopsys Verilog Compiler Simulator (VCS) tool. The results of the functional simulations of the latches are shown in FIGS. 16A-16D: D-latch-0 simulation (FIG. 16A), D-latch-1 simulation (FIG. 16B), D-latch-2 simulation (FIG. 16C), and D-latch-3 simulation (FIG. 16D). The results of the functional simulation of the MV clock generator 504 is shown in FIG. 17.

The FPGA-based implementation of this approach was experimented with by comparing multi-phase clock designs with N CDT networks with those implemented using log(N) CDT networks. The comparative study reported on the number of internal interconnects required to implement both forms of the designs and a timing analyzer was used to report the worst-case path delay and overall improvement in maximum clock speed.

Figure 18A:
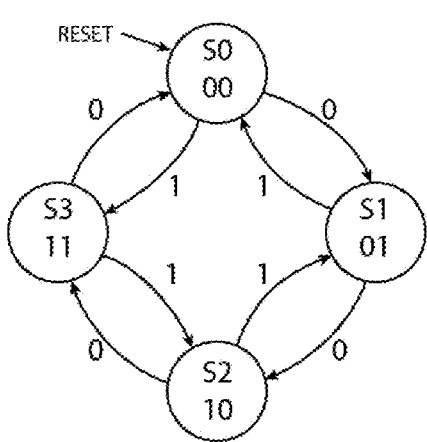
FIGS. 18A-18E are state diagrams for the example controller circuits in accordance with another embodiment of the present invention.
Figure 18C:
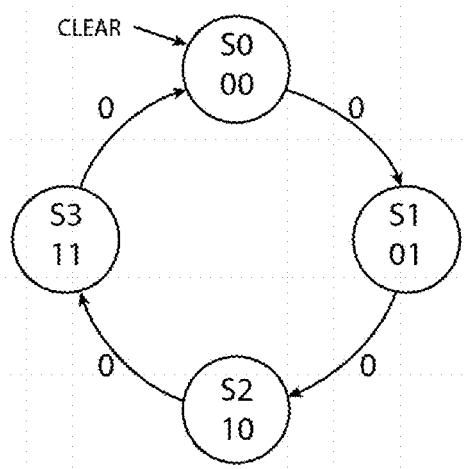
Figure 18B:
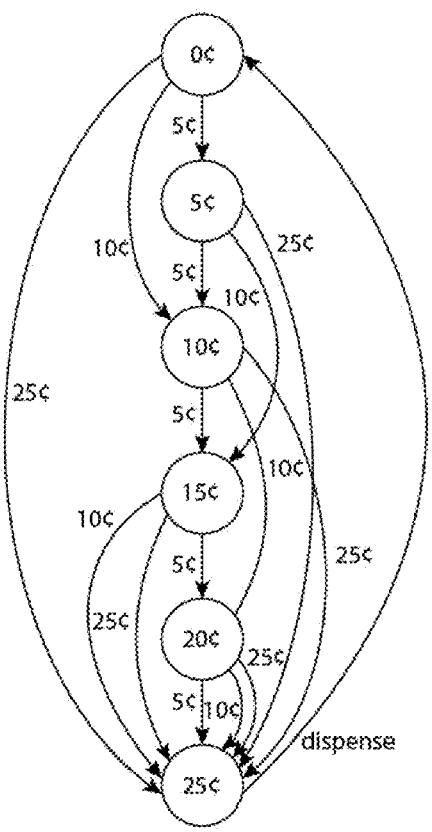
Figure 18D:
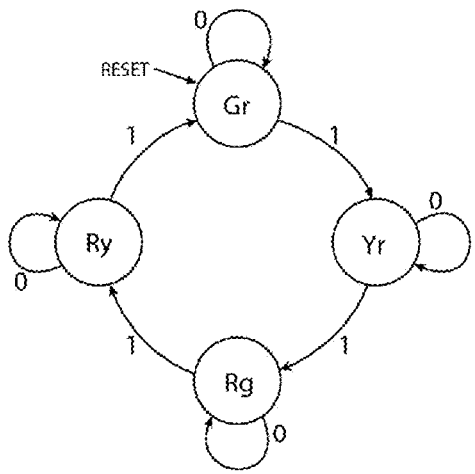

The circuit designs used for the comparison were Finite State Machine (FSM) controllers designed using Altera Quartus II (Subscription Edition 5.0) tool. The FSM controller for each implemented binary circuit has n different states with multiple binary non-overlapping clock distribution networks driving a subset of the level-sensitive latches compared to the single MVL clock distribution network implemented as log (N) CDT networks with latches driven by decoders in their equivalent MVL circuits. The example circuits were implemented both with a traditional multi-phased clocking approach using separate clock domain distribution networks and with the approach described here. State diagrams for the example controller circuits are provided in FIGS. 18A-18E: counter state diagram (FIG. 18A), vending machine state diagram (FIG. 18B), S0 state diagram (FIG. 18C), traffic controller state diagram (FIG. 18D) and electrical lock state diagram (FIG. 18E).

The synthesis of both binary and MVL versions of the circuits described in FIGS. 18A-18E were performed using the Altera QuartusII FPGA tool by representing the MVL clock signal logic values with their binary-encoded equivalents (0←00, 1←01, 2←10, and 3←11). All designs were mapped to a StratixII Altera FPGA. The results obtained for this comparison are summarized in FIG. 19 in terms of number of interconnects required and clock frequency for both designs. A state assignment method was used such that dynamic hazards in the output logic were avoided.

Figures 18E, 19:
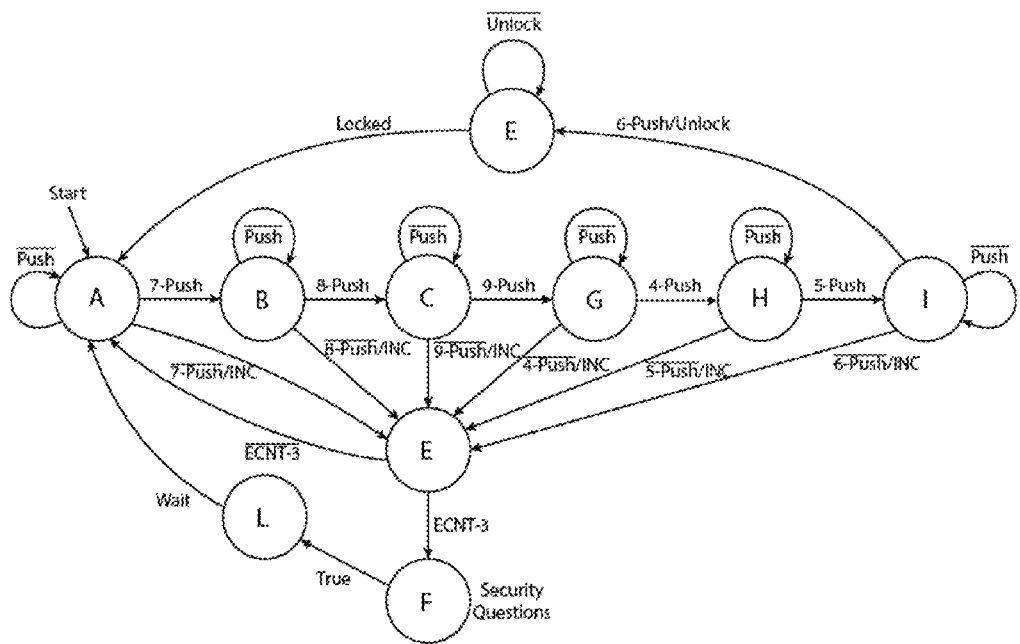
FIG. 19 is a chart showing a comparison of binary and MVL designs in FPGA technology in accordance with one embodiment of the present invention.

The table shown in FIG. 19 indicates a significant reduction in the required number of interconnects for the MVL circuit designs as compared to their binary counterparts. Because programmable interconnect structures represent a significant source of area and delay in FPGA designs, these reductions are significant and result in increased performance. The total number of interconnects is reduced since the total number of clock distribution networks decreased from N to $\log_2(N)$ for the binary clocked multi-phase design versus the MV clocked multi-phase design.

The counter circuit in FIG. 19 was initially designed with four multiple-phase shifted clock signals ($Clk_1$, $Clk_2$, $Clk_3$ and $Clk_4$) where each of the four clock signals drives one particular state to another. A design change was then made by replacing the four clock signals with a single clock signal (Clk), which assumes binary-encoded values of quaternary logic. Both designs were compared in terms of the number of interconnects and maximum clock frequency. Similarly, the comparison was performed on other controllers listed in FIG. 19.

The preceding discussion describes using modified literal selection gates, a MV clock generator, and a single multiple-valued clock distribution network for the purpose of implementing multi-phase clock designs with increased area and performance characteristics. The implementation of the present invention using custom VLSI or standard cell ASIC target technology was described including a discussion of the supporting new subcircuits required. Functional validations of several designs were accomplished using the SystemVerilog HDL and a transistor-level design and a simulation was carried out using the HSPICE simulator.

The present invention can be adapted to implementation in commercially available FPGA devices or ASICS based on binary-only logic cells and the preceding discussion described how the new subcircuits could be replaced using standard binary components such as a modular counter in place of the master clock generator and a binary decoder in place of the modified literal selection gate. Experimental results show improved performance and reduction in area for a set of example circuits when these ideas are applied as compared to their binary counterparts. This set of experimental results was obtained by using the Altera QuartusII EDA tool to implement several example circuits.

The MV clock generation circuit can be implemented using a suitable MV technology such as multi-threshold voltage-mode FET devices. Additional MV clock generation subcircuits and modified literal selection cells not specifically described herein can be designed for these purposes. A sample standard cell multiphase clock domain circuit can then be implemented using these new cells.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

The word "exemplary" is used herein to mean "serving as an example, instance, or illustration." Any embodiment described herein as "exemplary" is not necessarily to be construed as preferred or advantageous over other embodiments.

As used in this specification and claim(s), the words "comprising" (and any form of comprising, such as "comprise" and "comprises"), "having" (and any form of having, such as "have" and "has"), "including" (any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or items, such as BB, AAA, MB, BBC, AAABCCCC, CBBAAA, CABABB, and so forth. The skilled artisan will understand that typically there is not limit on the number of item or items in any combination, unless otherwise apparent from the context.

It will be understood by those of skill in the art that information and signals may be represented using any of a variety of different technologies and techniques (e.g., data, instructions, commands, information, signals, bits, symbols, and chips may be represented by voltages, currents, electromagnetic waves, magnetic fields or particles, optical fields or particles, or any combination thereof). Likewise, the various illustrative logical blocks, modules, circuits, and algorithm steps described herein may be implemented as electronic hardware, computer software, or combinations of both, depending on the application and functionality. Moreover, the various logical blocks, modules, and circuits described herein may be implemented or performed with a general purpose processor (e.g., microprocessor, conventional processor, controller, microcontroller, state machine or combination of computing devices), a digital signal processor ("DSP"), an application specific integrated circuit ("ASIC"), a field programmable gate array ("FPGA") or other programmable logic device, discrete gate or transistor logic, discrete hardware components, or any combination thereof designed to perform the functions described herein. Similarly, steps of a method or process described herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. Although preferred embodiments of the present invention have been described in detail, it will be understood by those skilled in the art that various modifications can be made therein without departing from the spirit and scope of the invention as set forth in the appended claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

REFERENCES

[1] Epstein, G., Frieder, G., and Rine, D. C., "The Development of Multiple-Valued Logic as Related to Computer Science", *IEEE Computer*, vol. 7, pp. 20-32, 1974.

[2] Smith, K. C., "The Prospects for Multivalued Logic: A Technology and Application View," *IEEE Trans Computers*, vol. 30, pp. 619-634, 1981.

[3] Hurst, S. L., "Multiple-Valued Logic-Its Status and Its Future," *IEEE Trans. Computers*, vol. 33, no. 12, pp. 1,160-1,179, December 1984.

[4] Gronowski P. E, et. al, "High-performance microprocessor design," *IEEE Journal of Solid-State Circuits*, vol. 33, iss. 5, May 1998.

[5] Miller, D. M. and Thornton, M. A., *Multiple-Valued Logic: Concepts and Representations*, Morgan & Claypool Publishers, San Rafael, Calif., ISBN 10-1598291904, 2008.

[6] Gong, M., Zhou, H., Li, L., Tao, J., & Zeng, X., "Binning Optimization for Transparently-Latched Circuits", *IEEE Transactions on Computer-Aided Design of Integrated Circuits and Systems*, 30(2), 270-283, 2011.

[7] Eby, G. and Friedman, "Clock Distribution Networks in Synchronous Digital Integrated Circuits," *Proc. of IEEE*, vol. 89, no. 5, 2001, pp. 665-692.

[8] Jackson, M. A. B. and Srinivasan, A., et. al., "Clock Routing for High-Performance ICs," *Proc. of ACM/IEEE Design Automation Conf.*, pp. 573-579, 1990.

[9] Papaefthymiou, M. C. and Randall, K. H., "TIM: A timing Package for two-phase, level-clocked circuitry," in *Proc. of ACM/IEEE Design Automation Conf.*, 1993, pp. 497-502.

[10] Oklobdzija, V. G., Stojanovic, V. M., Markovic, D. M. and Nedovic, N. M., *Digital System Clocking: High-Performance and Low-Power Aspects*, John Wiley & Sons, Inc. ISBN: 0-471-27447-X, 2003.

[11] Vasundara P. and Gurumurthy, K. S., "Static Random Access Memory Using Quaternary Latch", *Int. Jour. of Eng. Sci. and Tech.*, 2(11), 2010, 6371-6379.

[12] Datla, S., Thornton, M. A., Hendrix, L., and Henderson, D., "Quaternary addition circuits based on SUSLOC voltage-mode cells and modeling with SystemVerilog," *Proc. of IEEE In Sym. on Multiple-Valued Logic*, pp. 256-261, 2009.

[13] Ebeling, C. and Lockyear, B. "On the performance of level-clocked circuits," in *Proc. Advanced Research in VLSI*, Chapel Hill, N.C., 1995, pp. 342-356.

[14] Menon, R. P. and Thornton, M. A., "Global Multiple-valued Clock Approach for High-performance Multiphase Clock Integrated Circuits," in *Proc. of IEEE Int. Symposium on Multiple-Valued Logic*, pp. 19-24, 2012.

[15] Menon, R. P. and Thornton, M. A., "Single Clock Distribution Network for Multi-Phase Clock Integrated Circuits," U.S. Patent Application Ser. No. 61/599,598, February 2012.

[16] Kogge, P. M., *The Architecture of Pipelined Computers*, McGraw-Hill Publishing, 1981, ISBN 9780070352377.

[17] El-Moursy, M. A. and Friedman, E. G., "Exponentially Tapered H-Tree Clock Distribution Networks," *IEEE Trans. VLSI*, vol. 13, no. 8, 2005, pp. 971-975.

[18] Nedovic, N. and Oklobdzija, "Dual-Edge Triggered Storage Elements and Clocking Strategy for Low-Power Systems," *IEEE Trans. VLSI*, vol. 13, no. 5, 2005, pp. 577-590.

[19] Zhao, X., Minz, J. and Lim, S. K., "Low-Power and Reliable Clock Network Design for Through-Silicon Via (TSV) Based 3D ICs," *IEEE Trans. Comp., Pkg., and Man. Tech.*, vol. 1, no. 2, 2011, pp. 247-255.

[20] Santhanum, S. et al., "A Low-Cost, 300 MHz, RISC CPU with Attached Media Processor," *IEEE Jour. Solid-State Circ.*, vol. 33, no. 11, 1998, pp. 1829-1839.

[21] Sasao, T., "Multiple-Valued Logic and Optimization of Programmable Logic Arrays," *IEEE Computer Magazine*, 1988, pp. 71-80.

[22] Chattopadhyay, A. and Zilic, Z., "Reference-Based Clock Distribution Architectures," in *Proc. IEEE Midwest Symposium on Circ. and Sys.*, 2006, pp. 704-708.

[23] Kojima, H., Tanaka, S., and Sasaki, K., "Half-Swing Clocking Scheme for 75% Power Saving in Clocking Circuitry," in *Proc. IEEE Symposium on VLSI Circ.*, 1994, pp. 23-24.

U.S. Pat. No. 6,133,754 entitled "Multiple-valued logic circuit architecture; supplementary symmetrical logic circuit structure (SUS-LOC)."

U.S. Pat. No. 6,437,624 entitle "Edge-triggered latch with symmetric complementary pass-transistor logic data path."

U.S. Pat. No. 6,819,728 entitled "Self-correcting multiphase clock recovery."

U.S. Pat. No. 7,088,153 entitled "Data storage latch structure with micro-electromechanical switch."

U.S. Pat. No. 7,747,173 entitled "Multi-phase clocking of integrated circuits using photonics."

U.S. Patent Application Publication No. 2010/0301915 entitled "Latch with single clocked device."

What is claimed is:

1. A multi-valued logic circuit comprising:
a multi-valued logic (MVL) clock generator that generates a MVL clock signal comprising a first MVL level, one or more intermediate MVL levels and a Nth MVL level;
a single MVL clock signal distribution network connected to the MVL clock generator;
a first MVL selection circuit having a first enable/clock input connected to the single MVL clock signal distribution network, a first data input and a first output, wherein the first MVL selection circuit outputs a first binary clock signal via the first output having: (a) a first logic level whenever the MVL clock signal is equal to the first MVL level and the first data input receives the first logic level, (b) a second logic level whenever the MVL clock signal is equal to the first MVL level and the first data input receives the second logic level, and (c) a previous logic level of the first binary clock signal whenever the MVL clock signal is not equal to the first MVL level;
one or more intermediate MVL selection circuits, each intermediate MVL selection circuit having an intermediate enable/clock input connected to the single MVL clock signal distribution network, an intermediate data input and an intermediate output, wherein each intermediate MVL selection circuit corresponds to a specified intermediate MVL level selected from the one or more intermediate MVL levels and outputs an intermediate binary clock signal via the intermediate output having: (a) the first logic level whenever the MVL clock signal is equal to the specified intermediate MVL level and the intermediate data input receives the first logic level, (b) a second logic level whenever the MVL clock signal is equal to the specified intermediate MVL level and the intermediate data input receives the second logic level, and (c) a previous logic level of the intermediate binary clock signal whenever the MVL clock signal is not equal to the specified intermediate MVL level; and a Nth MVL selection circuit having a Nth enable/clock input connected to the single MVL clock signal distribution network, a Nth data input and a Nth output, wherein the Nth MVL selection circuit outputs a Nth binary clock signal via the Nth output having: (a) a first logic level whenever the MVL clock signal is equal to the Nth MVL level and the Nth data input receives the first logic level, (b) a second logic level whenever the MVL clock signal is equal to the Nth MVL level and the Nth data input receives the second logic level, and (c) a previous logic level of the Nth binary clock signal whenever the MVL clock signal is not equal to the Nth MVL level.

2. The multi-valued logic circuit as recited in claim 1, wherein:
the first MVL level comprises a logic "0";
the one or more intermediate MVL levels comprise a logic "1";
the Nth MVL level comprises a logic "2";
the first logic level comprises a logic "0"; and
the second logic level comprises a logic "1".

3. The multi-valued logic circuit as recited in claim 1, wherein:
each MVL level comprises a specified voltage level; and
the first MVL selection circuit further comprises an inverted first output;
each intermediate MVL selection circuit further comprises an inverted intermediate output; and
the Nth MVL selection circuit further comprises an inverted Nth output.

4. The multi-valued logic circuit as recited in claim 1, further comprising:
one or more first sub-circuits connected to the first output of the first MVL selection circuit;
one or more intermediate sub-circuits connected to the intermediate output of the intermediate MVL selection circuit;
one or more Nth sub-circuits connected to the Nth output of the Nth MVL selection circuit.

5. The multi-valued logic circuit as recited in claim 1, wherein:
the first MVL level comprises a logic "0";
the one or more intermediate MVL levels comprise a first intermediate MVL level comprising a logic "1", and a second intermediate MVL level comprising a logic "2";
the Nth MVL level comprises a logic "3";
the one or more intermediate MVL selection circuits comprise a first intermediate MVL selection circuit and a second intermediate MVL selection circuit;
the first logic level comprises a logic "0"; and
the second logic level comprises a logic "1".

6. The multi-valued logic circuit as recited in claim 1, wherein:
the first MVL selection circuit comprises a first modified literal selection gate connected to a first level sensitive latch such that: (a) the first enable/clock input comprises an input of the first modified literal selection gate, (b) the first data input comprises an input of the first level sensitive latch, (c) the first output comprises an output of the first level sensitive latch, (d) an output of the first modified literal selection gate is connected to an enable/clock input of the first level sensitive latch, and (e) the first modified literal selection gate outputs (1) the first logic level whenever the MVL clock signal is not equal to the first MVL level and (2) the second logic level whenever the MVL clock signal is equal to the first MVL level;

each intermediate MVL selection circuit comprises an intermediate modified literal selection gate connected to an intermediate level sensitive latch such that: (a) the intermediate enable/clock input comprises an input of the intermediate modified literal selection gate, (b) the intermediate data input comprises an input of the intermediate level sensitive latch, (c) the intermediate output comprises an output of the intermediate level sensitive latch, (d) an output of the intermediate modified literal selection gate is connected to an enable/clock input of the intermediate level sensitive latch, and (e) the intermediate modified literal selection gate outputs (1) the first logic level whenever the MVL clock signal is not equal to the specified intermediate MVL level and (2) the second logic level whenever the MVL clock signal is equal to the specified intermediate MVL level; and the Nth MVL selection circuit comprises a Nth modified literal selection gate connected to a Nth level sensitive latch such that: (a) the Nth enable/clock input comprises an input of the Nth modified literal selection gate, (b) the Nth data input comprises an input of the Nth level sensitive latch, (c) the Nth output comprises an output of the Nth level sensitive latch, (d) an output of the Nth modified literal selection gate is connected to an enable/clock input of the Nth level sensitive latch, and (e) the Nth modified literal selection gate outputs (1) the first logic level whenever the MVL clock signal is not equal to the Nth MVL level and (2) the second logic level whenever the MVL clock signal is equal to the Nth MVL level.

7. The multi-valued logic circuit as recited in claim 1, wherein the multi-valued logic (MVL) clock generator comprises:
a register having a clock input, a reset input, a data input and an output;
an N full adder circuit having a first input that receives the first logic level, a second input connected to the output of the register, an output connected to the data input of the register, and wherein N is greater than or equal to 3; and
wherein: (a) a reset signal sent to the reset input of the register initializes the output of the register to logic "0", (b) the N full adder circuit increments a logic level stored in the register, (c) the register stores the result of the N full adder circuit, and (d) the output of the register outputs a logic level sequence from logic "0" to logic "N−1".

8. The multi-valued logic circuit as recited in claim 1, wherein:
the MVL clock generator comprises a binary encoded MVL clock generator that generates a binary encoded clock signal corresponding to the first MVL level, the one or more intermediate MVL levels and the Nth MVL level, wherein the binary encoded clock signal comprises a first binary clock signal having the first logic level or the second logic level, and a second binary clock signal having the first logic level or the second logic level;
the single MVL clock signal distribution network comprises a first binary clock line and a second binary clock line;

the first MVL selection circuit comprises a first decoder connected to a first level sensitive latch such that: (a) the first enable/clock input comprises a first input of the first decoder connected to the first binary clock line and a second input of the first decoder connected to the second binary clock line, (b) the first data input comprises an input of the first level sensitive latch, (c) the first output comprises an output of the first level sensitive latch, (d) an output of the first decoder is connected to an enable/clock input of the first level sensitive latch, and (e) the first decoder outputs (1) the first logic level whenever the first and second binary clock signals do not correspond to the first MVL level and (2) the second logic level whenever the first and second binary clock signals correspond to the first MVL level;

each intermediate MVL selection circuit comprises an intermediate decoder connected to an intermediate level sensitive latch such that: (a) the intermediate enable/clock input comprises a first input of the intermediate decoder connected to the first binary clock line and a second input of the intermediate decoder connected to the second binary clock line, (b) the intermediate data input comprises an input of the intermediate level sensitive latch, (c) the intermediate output comprises an output of the intermediate level sensitive latch, (d) an output of the intermediate decoder is connected to an enable/clock input of the intermediate level sensitive latch, and (e) the intermediate decoder outputs (1) the first logic level whenever the first and second binary clock signals do not correspond to the specified intermediate MVL level and (2) the second logic level whenever the first and second binary clock signals correspond to the specified intermediate MVL level; and the Nth MVL selection circuit comprises a Nth decoder connected to a Nth level sensitive latch such that: (a) the Nth enable/clock input comprises a first input of the Nth decoder connected to the first binary clock line and a second input of the Nth decoder connected to the second binary clock line, (b) the Nth data input comprises an input of the Nth level sensitive latch, (c) the Nth output comprises an output of the Nth level sensitive latch, (d) an output of the Nth decoder is connected to an enable/clock input of the Nth level sensitive latch, and (e) the Nth decoder outputs (1) the first logic level whenever the first and second binary clock signals do not correspond to the Nth MVL level and (2) the second logic level whenever the first and second binary clock signals correspond to the Nth MVL level.

9. The multi-valued logic circuit as recited in claim 8, wherein each decoder is selected from the group comprising:
an AND gate having a first input comprising the first input of the decoder, a second input comprising the second input of the decoder, and an output comprising the output of the decoder;
the AND gate having a first inverter connected in series with the first input of the AND gate;
the AND gate having a second inverter connected in series with the second input of the AND gate; and
the AND gate having the first inverter connected in series with the first input of the AND gate and the second inverter connected in series with the second input of the AND gate.

10. The multi-valued logic circuit as recited in claim 8, wherein:
the first MVL level is encoded as the first binary clock signal having the first logic level and the second binary clock signal having the first logic level;

the intermediate MVL level is encoded as (a) the first binary clock signal having the first logic level and the second binary clock signal having the second logic level, or (b) the first binary clock signal having the second logic level and the second binary clock signal having the first logic level;
the Nth MVL level is encoded as the first binary clock signal having the second logic level and the second binary clock signal having the second logic level;
the first logic level comprises a logic "0"; and
the second logic level comprises a logic "1".

11. A multi-valued logic circuit comprising:
a multi-valued logic (MVL) clock generator that generates a MVL clock signal comprising a logic "0", a logic "1", a logic "2" and a logic "3";
a single MVL clock signal distribution network connected to the MVL clock generator;
a first MVL selection circuit having a first enable/clock input connected to the single MVL clock signal distribution network, a first data input, a first output and a first inverted output, wherein the first MVL selection circuit outputs a first binary clock signal having a logic level in accordance with the following table

| the first enable/clock input | the first data input | the first output | the first inverted output |
|---|---|---|---|
| 0 | 0 | 0 | 1 |
| 0 | 1 | 1 | 0 |
| 1 | X | $Q_{prev}$ | $\overline{Q}_{prev}$ |
| 2 | X | $Q_{prev}$ | $\overline{Q}_{prev}$ |
| 3 | X | $Q_{prev}$ | $\overline{Q}_{prev}$ | where X=logic "0" or logic "1", $Q_{prev}$=a previous logic level of the first binary clock signal, and $\overline{Q}_{prev}$=an inverse value of the previous logic level of the first binary clock signal;
a second MVL selection circuit having a second enable/clock input connected to the single MVL clock signal distribution network, a second data input, a second output and a second inverted output, wherein the second MVL selection circuit outputs a second binary clock signal having a logic level in accordance with the following table;

| the second enable/clock input | the second data input | the second output | the second inverted output |
|---|---|---|---|
| 0 | X | $Q_{prev}$ | $\overline{Q}_{prev}$ |
| 1 | 0 | 0 | 1 |
| 1 | 1 | 1 | 0 |
| 2 | X | $Q_{prev}$ | $\overline{Q}_{prev}$ |
| 3 | X | $Q_{prev}$ | $\overline{Q}_{prev}$ | a third MVL selection circuit having a third enable/clock input connected to the single MVL clock signal distribution network, a third data input, a third output and a third inverted output, wherein the third MVL selection circuit outputs a third binary clock signal having a logic level in accordance with the following table;

| the third enable/clock input | the third data input | the third output | the third inverted output |
|---|---|---|---|
| 0 | X | $Q_{prev}$ | $\overline{Q}_{prev}$ |
| 1 | X | $Q_{prev}$ | $\overline{Q}_{prev}$ |
| 2 | 0 | 0 | 1 |

| the third enable/clock input | the third data input | the third output | the third inverted output |
|---|---|---|---|
| 2 | 1 | 1 | 0 |
| 3 | X | $Q_{prev}$ | $\overline{Q}_{prev}$ | a fourth MVL selection circuit having a fourth enable/clock input connected to the single MVL clock signal distribution network, a fourth data input, a fourth output and a fourth inverted output, wherein the fourth MVL selection circuit outputs a fourth binary clock signal having a logic level in accordance with the following table

| the fourth enable/clock input | the fourth data input | the fourth output | the fourth inverted output |
|---|---|---|---|
| 0 | X | $Q_{prev}$ | $\overline{Q}_{prev}$ |
| 1 | X | $Q_{prev}$ | $\overline{Q}_{prev}$ |
| 2 | X | $Q_{prev}$ | $\overline{Q}_{prev}$ |
| 3 | 0 | 0 | 1 |
| 3 | 1 | 1 | 0. |

12. The multi-valued logic circuit as recited in claim 11, wherein each MVL level comprises a specified voltage level.

13. The multi-valued logic circuit as recited in claim 11, further comprising:
   one or more first sub-circuits connected to the first output of the first MVL selection circuit;
   one or more second sub-circuits connected to the second output of the second MVL selection circuit;
   one or more third sub-circuits connected to the third output of the third MVL selection circuit;
   one or more fourth sub-circuits connected to the fourth output of the fourth MVL selection circuit.

14. The multi-valued logic circuit as recited in claim 11, wherein:
   the first MVL selection circuit comprises a first modified literal selection gate connected to a first level sensitive latch such that: (a) the first enable/clock input comprises an input of the first modified literal selection gate, (b) the first data input comprises an input of the first level sensitive latch, (c) the first output comprises an output of the first level sensitive latch, (d) an output of the first modified literal selection gate is connected to an enable/clock input of the first level sensitive latch, and (e) the first modified literal selection gate outputs (1) the logic "0" whenever the first and second binary clock signals do not correspond to the logic "0" and (2) the logic "1" whenever the first and second binary clock signals correspond to the logic "0";
   the second MVL selection circuit comprises a second modified literal selection gate connected to a second level sensitive latch such that: (a) the second enable/clock input comprises an input of the second modified literal selection gate, (b) the second data input comprises an input of the second level sensitive latch, (c) the second output comprises an output of the second level sensitive latch, (d) an output of the second modified literal selection gate is connected to an enable/clock input of the second level sensitive latch, and (e) the second modified literal selection gate outputs (1) the logic "0" whenever the first and second binary clock signals do not correspond to the logic "1" and (2) the logic "1" whenever the first and second binary clock signals correspond to the logic "1";
   the third MVL selection circuit comprises a third modified literal selection gate connected to a third level sensitive latch such that: (a) the third enable/clock input comprises an input of the third modified literal selection gate, (b) the third data input comprises an input of the third level sensitive latch, (c) the third output comprises an output of the third level sensitive latch, (d) an output of the third modified literal selection gate is connected to an enable/clock input of the third level sensitive latch, and (e) the third modified literal selection gate outputs (1) the logic "0" whenever the first and second binary clock signals do not correspond to the logic "2" and (2) the logic "1" whenever the first and second binary clock signals correspond to the logic "2"; and
   the fourth MVL selection circuit comprises a fourth modified literal selection gate connected to a fourth level sensitive latch such that: (a) the fourth enable/clock input comprises an input of the fourth modified literal selection gate, (b) the fourth data input comprises an input of the fourth level sensitive latch, (c) the fourth output comprises an output of the fourth level sensitive latch, (d) an output of the fourth modified literal selection gate is connected to an enable/clock input of the fourth level sensitive latch, and (e) the fourth modified literal selection gate outputs (1) the logic "3" whenever the first and second binary clock signals do not correspond to the logic "0" and (2) the logic "1" whenever the first and second binary clock signals correspond to the logic "3".

15. The integrated circuit as recited in claim 11, wherein the multi-valued logic (MVL) clock generator comprises:
   a register having a clock input, a reset input, a data input and an output;
   a full adder circuit having a first input that receives the first logic level, a second input connected to the output of the register, and an output connected to the data input of the register; and
   wherein: (a) a reset signal sent to the reset input of the register initializes the output of the register to logic "0", (b) the full adder circuit increments a logic level stored in the register, (c) the register stores the result of the full adder circuit, and (d) the output of the register outputs a logic level sequence from logic "0" to logic "3".

16. The integrated circuit as recited in claim 11, wherein:
   the MVL clock generator comprises a binary encoded MVL clock generator that generates a binary encoded clock signal corresponding to the logic "0", the logic "1", the logic "2" and the logic "3", wherein the binary encoded clock signal comprises a first binary clock signal having the logic "0" or the logic "1", and a second binary clock signal having logic "0" or the logic "1";
   the single MVL clock signal distribution network comprises a first binary clock line and a second binary clock line;
   the first MVL selection circuit comprises a first decoder connected to a first level sensitive latch such that: (a) the first enable/clock input comprises a first input of the first decoder connected to the first binary clock line and a second input of the first decoder connected to the second binary clock line, (b) the first data input comprises an input of the first level sensitive latch, (c) the first output comprises an output of the first level sensitive latch, (d) an output of the first decoder is connected to an enable/clock input of the first level sensitive latch, and (e) the first decoder outputs (1) the logic "0" whenever the first and second binary clock signals do not correspond to the logic "0" and (2) the logic "1" whenever the first and second binary clock signals correspond to the logic "0";

the second MVL selection circuit comprises a second decoder connected to a second level sensitive latch such that: (a) the second enable/clock input comprises a first input of the second decoder connected to the first binary clock line and a second input of the first decoder connected to the second binary clock line, (b) the second data input comprises an input of the second level sensitive latch, (c) the second output comprises an output of the second level sensitive latch, (d) an output of the second decoder is connected to an enable/clock input of the second level sensitive latch, and (e) the second decoder outputs (1) the logic "0" whenever the first and second binary clock signals do not correspond to the logic "1" and (2) the logic "1" whenever the first and second binary clock signals correspond to the logic "1";

the third MVL selection circuit comprises a third decoder connected to a third level sensitive latch such that: (a) the third enable/clock input comprises a first input of the third decoder connected to the first binary clock line and a second input of the third decoder connected to the second binary clock line, (b) the third data input comprises an input of the third level sensitive latch, (c) the third output comprises an output of the third level sensitive latch, (d) an output of the third decoder is connected to an enable/clock input of the third level sensitive latch, and (e) the third decoder outputs (1) the logic "0" whenever the first and second binary clock signals do not correspond to the logic "2" and (2) the logic "1" whenever the first and second binary clock signals correspond to the logic "2"; and the fourth MVL selection circuit comprises a fourth decoder connected to a fourth level sensitive latch such that: (a) the fourth enable/clock input comprises a fourth input of the fourth decoder connected to the first binary clock line and a second input of the fourth decoder connected to the second binary clock line, (b) the fourth data input comprises an input of the fourth level sensitive latch, (c) the fourth output comprises an output of the fourth level sensitive latch, (d) an output of the fourth decoder is connected to an enable/clock input of the fourth level sensitive latch, and (e) the fourth decoder outputs (1) the logic "0" whenever the first and second binary clock signals do not correspond to the logic "3" and (2) the logic "1" whenever the first and second binary clock signals correspond to the logic "3".

17. The integrated circuit as recited in claim 16, wherein each decoder is selected from the group comprising:

an AND gate having a first input comprising the first input of the decoder, a second input comprising the second input of the decoder, and an output comprising the output of the decoder;

the AND gate having a first inverter connected in series with the first input of the AND gate;

the AND gate having a second inverter connected in series with the second input of the AND gate; and the AND gate having the first inverter connected in series with the first input of the AND gate and the second inverter connected in series with the second input of the AND gate.

18. The integrated circuit as recited in claim 16, wherein:

the first MVL level is encoded as the first binary clock signal having the logic "0" and the second binary clock signal having the logic "0";

the second MVL level is encoded as the first binary clock signal having the logic "0" and the second binary clock signal having the logic "1";

the third MVL level is encoded as the first binary clock signal having the logic "1" and the second binary clock signal having the logic "0"; and the fourth MVL level is encoded as the first binary clock signal having the logic "1" and the second binary clock signal having the logic "1".

19. An integrated circuit comprising:

a multi-valued logic (MVL) clock generator that generates a MVL clock signal comprising a first MVL level, a second MVL level, a third MVL level and a fourth MVL level;

a single MVL clock signal distribution network connected to the MVL clock generator;

a first MVL selection circuit having a first enable/clock input connected to the single MVL clock signal distribution network, a first data input and a first output, wherein the first MVL selection circuit outputs a first binary clock signal via the first output having: (a) a first logic level whenever the MVL clock signal is equal to the first MVL level and the first data input receives the first logic level, (b) a second logic level whenever the MVL clock signal is equal to the first MVL level and the first data input receives the second logic level, and (c) a previous logic level of the first binary clock signal whenever the MVL clock signal is not equal to the first MVL level;

one or more first sub-circuits connected to the first output of the first MVL selection circuit;

a second MVL selection circuit having a second enable/clock input connected to the single MVL clock signal distribution network, a second data input and a second output, wherein the second MVL selection circuit outputs a second binary clock signal via the second output having: (a) a first logic level whenever the MVL clock signal is equal to the second MVL level and the second data input receives the first logic level, (b) a second logic level whenever the MVL clock signal is equal to the second MVL level and the second data input receives the second logic level, and (c) a previous logic level of the second binary clock signal whenever the MVL clock signal is not equal to the second MVL level;

one or more second sub-circuits connected to the first output of the first MVL selection circuit;

a third MVL selection circuit having a third enable/clock input connected to the single MVL clock signal distribution network, a third data input and a third output, wherein the third MVL selection circuit outputs a third binary clock signal via the third output having: (a) a first logic level whenever the MVL clock signal is equal to the third MVL level and the third data input receives the first logic level, (b) a second logic level whenever the MVL clock signal is equal to the third MVL level and the third data input receives the second logic level, and (c) a previous logic level of the third binary clock signal whenever the MVL clock signal is not equal to the third MVL level;

one or more third sub-circuits connected to the first output of the first MVL selection circuit;

a fourth MVL selection circuit having a fourth enable/clock input connected to the single MVL clock signal distribution network, a fourth data input and a fourth output, wherein the fourth MVL selection circuit outputs a fourth binary clock signal via the fourth output having: (a) a first logic level whenever the MVL clock signal is equal to the fourth MVL level and the fourth data input receives the first logic level, (b) a second logic level whenever the MVL clock signal is equal to the fourth MVL level and the fourth data input receives the second logic level, and (c) a previous logic level of the fourth binary clock signal whenever the MVL clock signal is not equal to the fourth MVL level; and one or more fourth sub-circuits connected to the first output of the first MVL selection circuit.

20. The integrated circuit as recited in claim 19, wherein:
the first MVL level comprises a logic "0";
the second MVL level comprises a logic "1";
the third MVL levels comprise a logic "2";
the fourth MVL level comprises a logic "3";
the first logic level comprises a logic "0"; and
the second logic level comprises a logic "1".

21. The integrated circuit as recited in claim 19, wherein:
each MVL level comprises a specified voltage level; and
the first MVL selection circuit further comprises an inverted first output;
the second MVL selection circuit further comprises an inverted second output;
the third MVL selection circuit further comprises an inverted third output; and
the fourth MVL selection circuit further comprises an inverted fourth output.

22. The integrated circuit as recited in claim 19, wherein each MVL level comprises a specified voltage level.

23. The integrated circuit as recited in claim 19, wherein:
the first MVL selection circuit comprises a first modified literal selection gate connected to a first level sensitive latch such that: (a) the first enable/clock input comprises an input of the first modified literal selection gate, (b) the first data input comprises an input of the first level sensitive latch, (c) the first output comprises an output of the first level sensitive latch, (d) an output of the first modified literal selection gate is connected to an enable/clock input of the first level sensitive latch, and (e) the first modified literal selection gate outputs (1) the first logic level whenever the MVL clock signal is not equal to the first MVL level and (2) the second logic level whenever the MVL clock signal is equal to the first MVL level;
the second MVL selection circuit comprises a second modified literal selection gate connected to a second level sensitive latch such that: (a) the second enable/clock input comprises an input of the second modified literal selection gate, (b) the second data input comprises an input of the second level sensitive latch, (c) the second output comprises an output of the second level sensitive latch, (d) an output of the second modified literal selection gate is connected to an enable/clock input of the second level sensitive latch, and (e) the second modified literal selection gate outputs (1) the first logic level whenever the MVL clock signal is not equal to the second MVL level and (2) the second logic level whenever the MVL clock signal is equal to the second MVL level;
the third MVL selection circuit comprises a third modified literal selection gate connected to a third level sensitive latch such that: (a) the third enable/clock input comprises an input of the third modified literal selection gate, (b) the third data input comprises an input of the third level sensitive latch, (c) the third output comprises an output of the third level sensitive latch, (d) an output of the third modified literal selection gate is connected to an enable/clock input of the third level sensitive latch, and (e) the third modified literal selection gate outputs (1) the first logic level whenever the MVL clock signal is not equal to the third MVL level and (2) the second logic level whenever the MVL clock signal is equal to the third MVL level; and the fourth MVL selection circuit comprises a fourth modified literal selection gate connected to a fourth level sensitive latch such that: (a) the fourth enable/clock input comprises an input of the fourth modified literal selection gate, (b) the fourth data input comprises an input of the fourth level sensitive latch, (c) the fourth output comprises an output of the fourth level sensitive latch, (d) an output of the fourth modified literal selection gate is connected to an enable/clock input of the fourth level sensitive latch, and (e) the fourth modified literal selection gate outputs (1) the first logic level whenever the MVL clock signal is not equal to the fourth MVL level and (2) the second logic level whenever the MVL clock signal is equal to the fourth MVL level.

24. The integrated circuit as recited in claim 19, wherein the multi-valued logic (MVL) clock generator comprises:
a register having a clock input, a reset input, a data input and an output;
a full adder circuit having a first input that receives the first logic level, a second input connected to the output of the register, and an output connected to the data input of the register; and
wherein: (a) a reset signal sent to the reset input of the register initializes the output of the register to logic "0", (b) the full adder circuit increments a logic level stored in the register, (c) the register stores the result of the full adder circuit, and (d) the output of the register outputs a logic level sequence from logic "0" to logic "3".

25. The integrated circuit as recited in claim 19, wherein:
the MVL clock generator comprises a binary encoded MVL clock generator that generates a binary encoded clock signal corresponding to the first MVL level, the second MVL level, the third MVL level and the fourth MVL level, wherein the binary encoded clock signal comprises a first binary clock signal having the first logic level or the second logic level, and a second binary clock signal having the first logic level or the second logic level;
the single MVL clock signal distribution network comprises a first binary clock line and a second binary clock line;
the first MVL selection circuit comprises a first decoder connected to a first level sensitive latch such that: (a) the first enable/clock input comprises a first input of the first decoder connected to the first binary clock line and a second input of the first decoder connected to the second binary clock line, (b) the first data input comprises an input of the first level sensitive latch, (c) the first output comprises an output of the first level sensitive latch, (d) an output of the first decoder is connected to an enable/clock input of the first level sensitive latch, and (e) the first decoder outputs (1) the first logic level whenever the first and second binary clock signals do not correspond to the first MVL level and (2) the second logic level whenever the first and second binary clock signals correspond to the first MVL level;
the second MVL selection circuit comprises a second decoder connected to a second level sensitive latch such that: (a) the second enable/clock input comprises a first input of the second decoder connected to the first binary clock line and a second input of the first decoder connected to the second binary clock line, (b) the second data input comprises an input of the second level sensitive latch, (c) the second output comprises an output of the second level sensitive latch, (d) an output of the second decoder is connected to an enable/clock input of the second level sensitive latch, and (e) the second decoder outputs (1) the first logic level whenever the first and second binary clock signals do not correspond to the second MVL level and (2) the second logic level whenever the first and second binary clock signals correspond to the second MVL level;

the third MVL selection circuit comprises a third decoder connected to a third level sensitive latch such that: (a) the third enable/clock input comprises a first input of the third decoder connected to the first binary clock line and a second input of the third decoder connected to the second binary clock line, (b) the third data input comprises an input of the third level sensitive latch, (c) the third output comprises an output of the third level sensitive latch, (d) an output of the third decoder is connected to an enable/clock input of the third level sensitive latch, and (e) the third decoder outputs (1) the first logic level whenever the first and second binary clock signals do not correspond to the third MVL level and (2) the second logic level whenever the first and second binary clock signals correspond to the third MVL level; and the fourth MVL selection circuit comprises a fourth decoder connected to a fourth level sensitive latch such that: (a) the fourth enable/clock input comprises a fourth input of the fourth decoder connected to the first binary clock line and a second input of the fourth decoder connected to the second binary clock line, (b) the fourth data input comprises an input of the fourth level sensitive latch, (c) the fourth output comprises an output of the fourth level sensitive latch, (d) an output of the fourth decoder is connected to an enable/clock input of the fourth level sensitive latch, and (e) the fourth decoder outputs (1) the first logic level whenever the first and second binary clock signals do not correspond to the fourth MVL level and (2) the second logic level whenever the first and second binary clock signals correspond to the fourth MVL level.

26. The integrated circuit as recited in claim 25, wherein each decoder is selected from the group comprising:
   an AND gate having a first input comprising the first input of the decoder, a second input comprising the second input of the decoder, and an output comprising the output of the decoder;
   the AND gate having a first inverter connected in series with the first input of the AND gate;
   the AND gate having a second inverter connected in series with the second input of the AND gate; and
   the AND gate having the first inverter connected in series with the first input of the AND gate and the second inverter connected in series with the second input of the AND gate.

27. The integrated circuit as recited in claim 25, wherein:
   the first MVL level is encoded as the first binary clock signal having the first logic level and the second binary clock signal having the first logic level;
   the second MVL level is encoded as the first binary clock signal having the first logic level and the second binary clock signal having the second logic level;
   the third MVL level is encoded as the first binary clock signal having the second logic level and the second binary clock signal having the first logic level;
   the fourth MVL level is encoded as the first binary clock signal having the second logic level and the second binary clock signal having the second logic level;
   the first logic level comprises a logic "0"; and
   the second logic level comprises a logic "1".

28. A method for generating a set of binary clock signals comprising the steps of:
   generating a multi-valued logic (MVL) clock signal comprising three or more MVL levels;
   transmitting the MVL clock signal to three or more MVL selection circuits using a single MVL clock signal distribution network;
   receiving the MVL clock signal at each MVL selection circuit, wherein each MVL selection circuit corresponds to a specified MVL level selected from the three or more MVL levels; and
   for each MVL selection circuit, outputting a binary clock signal having (a) a first logic level whenever the MVL clock signal is equal to the specified MVL level and a data input receives the first logic level, (b) a second logic level whenever the MVL clock signal is equal to the specified MVL level and the data input receives the second logic level, and (c) a previous logic level of the binary clock signal whenever the MVL clock signal is not equal to the specified MVL level.

29. The method as recited in claim 28, wherein:
   the three for more MVL levels comprise a logic "0", a logic "1", and a logic "2";
   the first logic level comprises a logic "0"; and
   the second logic level comprises a logic "1".

30. The method as recited in claim 28, wherein:
   the three for more MVL levels comprise a logic "0", a logic "1", a logic "2", and a logic "3";
   the first logic level comprises a logic "0"; and
   the second logic level comprises a logic "1".

31. The method as recited in claim 28, further comprising one or more sub-circuits connected to each MVL selection circuit.

32. The method as recited in claim 28, wherein each MVL selection circuit comprises a modified literal selection gate connected to a level sensitive latch.

33. The method as recited in claim 28, wherein the MVL clock generator comprises:
   a register having a clock input, a reset input, a data input and an output;
   an N full adder circuit having a first input that receives the first logic level, a second input connected to the output of the register, an output connected to the data input of the register, and wherein N is greater than or equal to 3; and
   wherein: (a) a reset signal sent to the reset input of the register initializes the output of the register to logic "0", (b) the N full adder circuit increments a logic level stored in the register, (c) the register stores the result of the N full adder circuit, and (d) the output of the register outputs a logic level sequence from logic "0" to logic "N−1".

34. The method as recited in claim 28, wherein:
   the MVL clock generator comprises a binary encoded MVL clock generator that generates a binary encoded clock signal corresponding to the three or more MVL levels, wherein the binary encoded clock signal comprises a first binary clock signal having the first logic level or the second logic level, and a second binary clock signal having the first logic level or the second logic level;

the single MVL clock signal distribution network comprises a first binary clock line and a second binary clock line; and each MVL selection circuit comprises a decoder connected to a level sensitive latch such that: (a) a first input of the decoder is connected to the first binary clock line and a second input of the first decoder is connected to the second binary clock line, and (b) the decoder outputs (1) the first logic level whenever the first and second binary clock signals do not correspond to the specified MVL level, (2) the second logic level whenever the first and second binary clock signals correspond to the specified MVL level.

35. The method as recited in claim 34, wherein each decoder is selected from the group comprising:

an AND gate having a first input comprising the first input of the decoder, a second input comprising the second input of the decoder, and an output comprising the output of the decoder;

the AND gate having a first inverter connected in series with the first input of the AND gate;

the AND gate having a second inverter connected in series with the second input of the AND gate; and the AND gate having the first inverter connected in series with the first input of the AND gate and the second inverter connected in series with the second input of the AND gate.

* * * * *